(12) United States Patent
Choi et al.

(10) Patent No.: US 7,009,893 B2
(45) Date of Patent: Mar. 7, 2006

(54) RANGE SELECTABLE ADDRESS DECODER AND FRAME MEMORY DEVICE FOR PROCESSING GRAPHIC DATA AT HIGH SPEED USING THE SAME

(75) Inventors: Han Jun Choi, Seongnam-si (KR); Duck Myung Lee, Seoul (KR); Hag Keun Kim, Kyungki-do (KR)

(73) Assignee: Nexuschips Co., Ltd., Seoul (KR)

( * ) Notice: Subject to any disclaimer, the term of this patent is extended or adjusted under 35 U.S.C. 154(b) by 124 days.

(21) Appl. No.: 10/717,459

(22) Filed: Nov. 21, 2003

(65) Prior Publication Data

US 2004/0105336 A1    Jun. 3, 2004

(30) Foreign Application Priority Data

Dec. 2, 2002    (KR) ............... 10-2002-0075814

(51) Int. Cl.
   *G11C 7/00*    (2006.01)
   *G11C 8/00*    (2006.01)

(52) U.S. Cl. .................. 365/189.08; 365/230.06

(58) Field of Classification Search ........... 365/189.08, 365/230.06
   See application file for complete search history.

(56) References Cited

U.S. PATENT DOCUMENTS

| 5,036,493 | A | * | 7/1991 | Nielsen .................. 365/230.06 |
| 5,208,781 | A | * | 5/1993 | Matsushima ........... 365/230.06 |
| 5,999,480 | A | * | 12/1999 | Ong et al. .............. 365/230.06 |
| 6,026,046 | A | * | 2/2000 | Larson .................... 365/230.06 |
| 6,671,210 | B1 | * | 12/2003 | Watanabe et al. ....... 365/230.06 |

* cited by examiner

*Primary Examiner*—Trong Phan
(74) *Attorney, Agent, or Firm*—Rosenberg, Klein & Lee

(57) ABSTRACT

A frame memory device capable of processing graphic data at high speed so as to reduce a burden to be imposed on a processor in a portable terminal of a limited size is disclosed. The frame memory device includes a number of memory cells aligned in a matrix form, and range selectable row/column address decoders capable of designating row/column addresses of a desired range by two addresses, to thereby select a number of memory cells of a desired range all at a time and write data in the selected memory cells.

18 Claims, 17 Drawing Sheets

FIG. 9A

```
1ST DECODER:  000000000111 1 000
 Shift Right : 000000000011 1 1000
 ~Shift Left : 111111110000 1 111

LOW-EN : 000000000000 1 000
```

FIG. 9B

```
1ST DECODER:  0000000001 11 1000
 Shift Right : 0000000000 11 11000
 ~Shift Left : 00000000011 11 0000

MID-EN : 0000000000 11 0000
```

FIG. 9C

1ST DECODER : 000000000 | 1 | 111000
Shift Right : 111111111 | 1 | 0000111
~Shift Left : 000000001 | 1 | 110000

HI-EN : 000000000 | 1 | 000000

RANGE SELECTABLE ADDRESS DECODER AND FRAME MEMORY DEVICE FOR PROCESSING GRAPHIC DATA AT HIGH SPEED USING THE SAME

BACKGROUND OF THE INVENTION

1. Field of the Invention

The present invention relates to a range selectable address decoder and a frame memory device for processing graphic data at high speed using the same, and more particularly, to a range selectable address decoder and a frame memory device using the same for processing graphic data at high speed, in which row/column address decoders capable of designating addresses of a desired range by two addresses are used, to thereby select a number of memory cells of a desired range all at a time and write data in the selected memory cells.

2. Description of the Related Art

In general, a portable terminal having a processor having a data processing capacity lower than a general purpose personal computer (PC) such as a mobile communications terminal or a personal digital assistant (PDA) which will be referred to as a portable terminal, requires a high speed signal processing technology for processing graphic data at high speed, in order to display animation images, games or advertises using graphic data on a display such as a liquid crystal display (LCD).

In particular, LCD panels are changed from super twist nematic (STN) to thin film transistor (TFT) and an organic electroluminescent (EL) display capable of performing a signal response faster than a TFT LCD is under development. Also, a portable terminal adopts functions of processing various kinds of sounds such as a 40-chord bell sound function and various kinds of images taken by a 300,000-pixel digital camera. In contrast, the size of the portable terminal becomes more compact. Thus, the portable terminal confronts a double difficulty that should embody a high-speed signal processing within a limited space.

Thus, such a portable terminal requires a system that a processor to be mounted for processing signals should operate at high performance without having much burden when performing a high-performance signal processing.

Meanwhile, when video signals are displayed on a display such as an LCD of a conventional portable terminal, graphic data is temporarily written in a frame memory device formed of RAMs according to designation of addresses by the processor (a host), and then data is read from the frame memory device to be displayed on a display.

A general memory device, i.e., RAMs that are used in a frame memory device has a structure of writing only single data with respect to a single address, becomes an obstacle in processing graphic data at high speed, and imposes a heavy burden on a processor.

That is, as shown in FIG. 1, a conventional RAM having the above-described structure includes a column address decoder 2 for selecting a column address with respect to a number of memory cells 1 that are aligned in a matrix form, and a row address decoder 3 for selecting a row address with respect to the number of memory cells 1. In such a RAM, one column address and one row address are applied to the column address decoder 2 and the row address decoder 3, to thereby enable one memory cell to be selected to perform a write operation in order to store input data.

Here, it is assumed that a conventional graphic processing method is a case of drawing a straight line that is formed by column addresses of 1 to 100 for a certain row address. That is, in the case that row address values are the Y-axis values on a screen and column address values are the X-axis values on the screen, the straight line means a line parallel with the X-axis. Thus, a memory adopting a conventional single memory cell designation method should execute memory write operations one-hundred times in order to draw a single straight line. Accordingly, the above-described conventional technology need to be improved inevitably in order to process graphic data at high speed.

Further, in order to draw a rectangle that is formed of row addresses of 1 to 100 and column addresses of 1 to 100, the conventional technology should perform memory write operations 100×100, that is, 10,000 times. As a result, a graphic data processing speed is slow and a burden to be imposed on a processor due to the above-described repeated write operations increases, in the conventional technology.

A technique for writing data into memory cells by memory cell block unit is disclosed in PCT International Publication Gazette No. WO 96/36052. In this prior art, it is impossible to designate a number of memory cells by user's desired pattern at a time so as to write graphic data into the number of designated memory cells.

SUMMARY OF THE INVENTION

To solve the above problems, it is an object of the present invention to provide a frame memory device capable of processing graphic data at high speed, in which row/column address decoders capable of designating addresses of a desired range by two addresses are used, to thereby select a number of memory cells of a desired range all at a time and write data in the selected memory cells, so as to reduce a burden to be imposed on a processor in a portable terminal of a limited size.

It is another object of the present invention to provide a frame memory device capable of processing graphic data at high speed, in which a range selectable address decoder capable of designating addresses of a desired range by two addresses is used as one of row/column address decoders, and the other thereof is used as an address decoder capable of designating two address lines by using two addresses to then combine the range selectable address decoder with the address decoder that designates two address lines by two addresses, to thereby select a number of memory cells corresponding to two straight lines of a desired range all at a time and write data in the selected memory cells.

It is still another object of the present invention to provide a frame memory device capable of processing graphic data at high speed, in which a pair of row/column address decoders capable of designating two address lines by using two addresses, respectively are combined with each other, to thereby select four memory cells of desired four points all at a time and write data in the selected memory cells.

It is yet another object of the present invention to provide a range selectable address decoder capable of designating addresses of a desired range by two addresses, to thereby select and designate a number of memory cells of a desired range all at a time.

To accomplish the above object of the present invention, there is provided a frame memory device according to an aspect of the present invention, the frame memory device comprising: a number of memory cells aligned in a matrix form; a range selectable column address decoder for receiving first and second column addresses and generating at least one successive column address selection signal in order to designate at least one successive column address range with respect to the number of memory cells; and a range selectable row address decoder for receiving first and second row addresses and generating at least one successive row address selection signal in order to designate at least one successive row address range with respect to the number of memory cells, wherein a graphic data write operation is accomplished all at a time with respect to the number of memory cells selected by the at least one successive column address selection signal and the at least one successive row address selection signal.

According to another aspect of the present invention, there is provided a frame memory device comprising: a number of memory cells aligned in a matrix form; a range selectable column address decoder for receiving high and low column addresses and generating at least one column address selection signal in order to designate at least one column address range with respect to the number of memory cells; and a general purpose address decoder for receiving high and low row addresses and generating two row address selection signals in order to designate two row addresses with respect to the number of memory cells, wherein memory cells located from a low column address to a high column address designated by the range selectable address decoder, are designated on two row lines designated by the general purpose address decoder according to the input of the high and low row addresses, to thereby write graphic data of two parallel lines that are parallel with the X-axis.

According to still another aspect of the present invention, there is provided a frame memory device comprising: a number of memory cells aligned in a matrix form; a range selectable row address decoder for receiving high and low row addresses and generating at least one row address selection signal in order to designate at least one row address range with respect to the number of memory cells; and a general purpose address decoder for receiving high and low column addresses and generating two column address selection signals in order to designate two column addresses with respect to the number of memory cells, wherein memory cells located from a low row address to a high row address which are designated by the range selectable address decoder, are designated on two column lines designated by the general purpose address decoder according to the input of the high and low row addresses, to thereby write graphic data of two parallel lines that are parallel with the Y-axis.

The range selectable column address decoder and the range selectable row address decoder perform selection of an address of a successive range, respectively, in which the total 256 addresses are divided into 16 groups in the case that the first and second column addresses and the first and second row addresses are 8-bit signals, respectively, a corresponding group by respective four upper bits of the first and second address inputs in units of 16 addresses, a low address range is selected among 16 addresses in the group selected by four lower bits of the row address input among the first and second addresses, a high address range is selected among 16 addresses in the group selected by four lower bits of the high address input among the first and second addresses, and all successive addresses are selected between the selected first and second addresses, to thereby accomplish selection of addresses of a successive range.

Also, each of the range selectable column address decoder and the range selectable row address decoder is a 8-to-256 range selectable decoder.

The 8-to-256 range selectable decoder includes: an exclusive OR gate which judges whether or not values of four upper bits in the two high and low address inputs equal one other, and selects only one group if the values of four upper bits equal one another, but selects two or more groups if the values of four upper bits do not equal one another, to thereby generate an output selection signal with respect to a multiplexer; a group selection circuit having a first range selectable address decoder for selecting a range between four upper bits of the two high and low addresses, and generating a low enable signal, a middle enable signal, and a high enable signal which select a low group, a middle group and a high group, respectively, if four upper bits of the two high and low address inputs do not equal one another; a second range selectable decoder for selecting a range value between "1111" and four lower bits of a low address input value in order to select a low address range among 16 addresses in the low group selected by the four lower bits of the low address input; a third range selectable decoder for selecting a range value between "0000" and four lower bits of a high address input value in order to select a high address range among 16 addresses in the high group selected by the four lower bits of the high address input; a first multiplexer for selectively outputting any one input among the four lower bits of the low address input and the "0000" to the input terminal of the third range selectable decoder, according to an output of the group selection circuit; a second multiplexer group having 16 multiplexers, in which "0" is input to one input terminal of each multiplexer and a low enable signal is input to the other terminal thereof, and the output of the group selection circuit is input as an output selection signal; a third multiplexer group having 16 multiplexers, in which "0" is input to one input terminal of each multiplexer and a middle enable signal is input to the other terminal thereof, and the output of the group selection circuit is input as an output selection signal; a fourth multiplexer group having 16 multiplexers, in which the output of the first range selectable decoder is input to one input terminal of each multiplexer and a high enable signal is input to the other terminal thereof, and the output of the group selection circuit is input as an output selection signal; a first AND gate group having 16 AND gates in which the output of the second range selectable decoder is connected to one terminal of each AND gate and each output of the 16 multiplexers in the second multiplexer group is connected to the other input terminal thereof; a second AND gate group having 16 AND gates in which "1" is applied to one terminal of each AND gate and each output of the 16 multiplexers in the third multiplexer group is connected to the other input terminal thereof, in order to output "1" to all outputs of the 16 AND gates, so that all addresses between the selected low and high addresses are selected; a third AND gate group having 16 AND gates in which the output of the third range selectable decoder is connected to one terminal of each AND gate and each output of the 16 multiplexers in the fourth multiplexer group is connected to the other input terminal thereof; and an OR gate for logically summing the outputs of the first through third gate groups.

Also, each of the first through third range selectable decoders is a 4-to-16 range selectable decoder.

Preferably, the 4-to-16 range selectable address decoder includes: a first general purpose decoder for generating a 16-bit decoded output when the four-bit low address is applied thereto; a second general purpose decoder for generating a 16-bit decoded output when the four-bit high address is applied thereto; and first through thirtieth XOR gates for processing first through sixteenth outputs of the first decoder and first through sixteenth outputs of the second decoder, and selecting a range value between the low address and the high address.

In the frame memory device, if the first and second column addresses equal each other and the first and second low addresses do not equal each other, a number of memory cells are selected on a single straight line parallel with the Y-axis corresponding to the successive addresses between the first and second low addresses. If the first and second low addresses equal each other and the first and second column addresses do not equal each other, a number of memory cells are selected on a single straight line parallel with the X-axis corresponding to the successive addresses between the first and second column addresses.

In the frame memory device, if the first and second column addresses do not equal each other and the first and second row addresses do not equal each other, all memory cells are selected in a rectangle corresponding to the successive addresses between the first and second column addresses and the successive addresses between the first and second row addresses.

According to yet another aspect of the present invention, there is provided a frame memory device comprising: a number of memory cells aligned in a matrix form; a first general purpose decoder for receiving high and low column addresses and generating two column address selection signals to designate two column addresses with respect to the number of memory cells; and a second general purpose decoder for receiving high and low row addresses and generating two row address selection signals to designate two row addresses with respect to the number of memory cells, wherein graphic data is written by a single write operation all at a time, in four memory cells of a point where two row lines designated by the general purpose address decoder according to the input of the high and low row addresses and two column lines designated by the general purpose address decoder according to the input of the high and low column addresses cross-sect each other.

The general purpose address decoder comprises: first and second general purpose 8-to-256 decoders for enabling one output among 256 outputs when 8-bit high and low addresses are input thereto; and 256 OR gates for logically summing the outputs of an identical level from the first and second 8-to-256 decoders.

As described above, the present invention can select all memory cells of a certain range in both a row address decoder and a column address decoder to then enable all the selected memory cells to perform a write operation, to accordingly draw an address designated rectangle with only a write operation. Thus, the present invention enables a portable terminal such as a portable phone and a personal digital assistant (PDA) to process graphic data at high speed since a graphic processing stage located in the front terminal of the frame memory device can perform a next operation swiftly without having any standby interval until a memory write operation is completed.

BRIEF DESCRIPTION OF THE DRAWINGS

The above and other objects and advantages of the present invention will become more apparent by describing the preferred embodiment thereof in more detail with reference to the accompanying drawings in which:

FIGS. 9A through 9C are diagrams illustrating group selection signal processing steps of a group selection circuit shown in FIG. 5, in the case that two or more unit groups are selected in a range selectable address decoder according to the present invention;

DETAILED DESCRIPTION OF THE INVENTION

A range selectable address decoder and a frame memory device for processing graphic data at high speed using the same according to preferred embodiments of the present invention will be described below with reference to the accompanying drawings.

In the following description, $1_2$ denotes "1" of a binary number, $3_{10}$ denotes "3" as a decimal number, 2'b11 denotes two-bit signal "11" of a binary number, 4'b1111 denotes four-bit signal "1111" of a binary number, 16'hffff denotes "1111_1111_1111_1111" of $0000\_0111\_1111\_0000_2$. denotes "0000011111110000" of a binary number.

Figure 2:
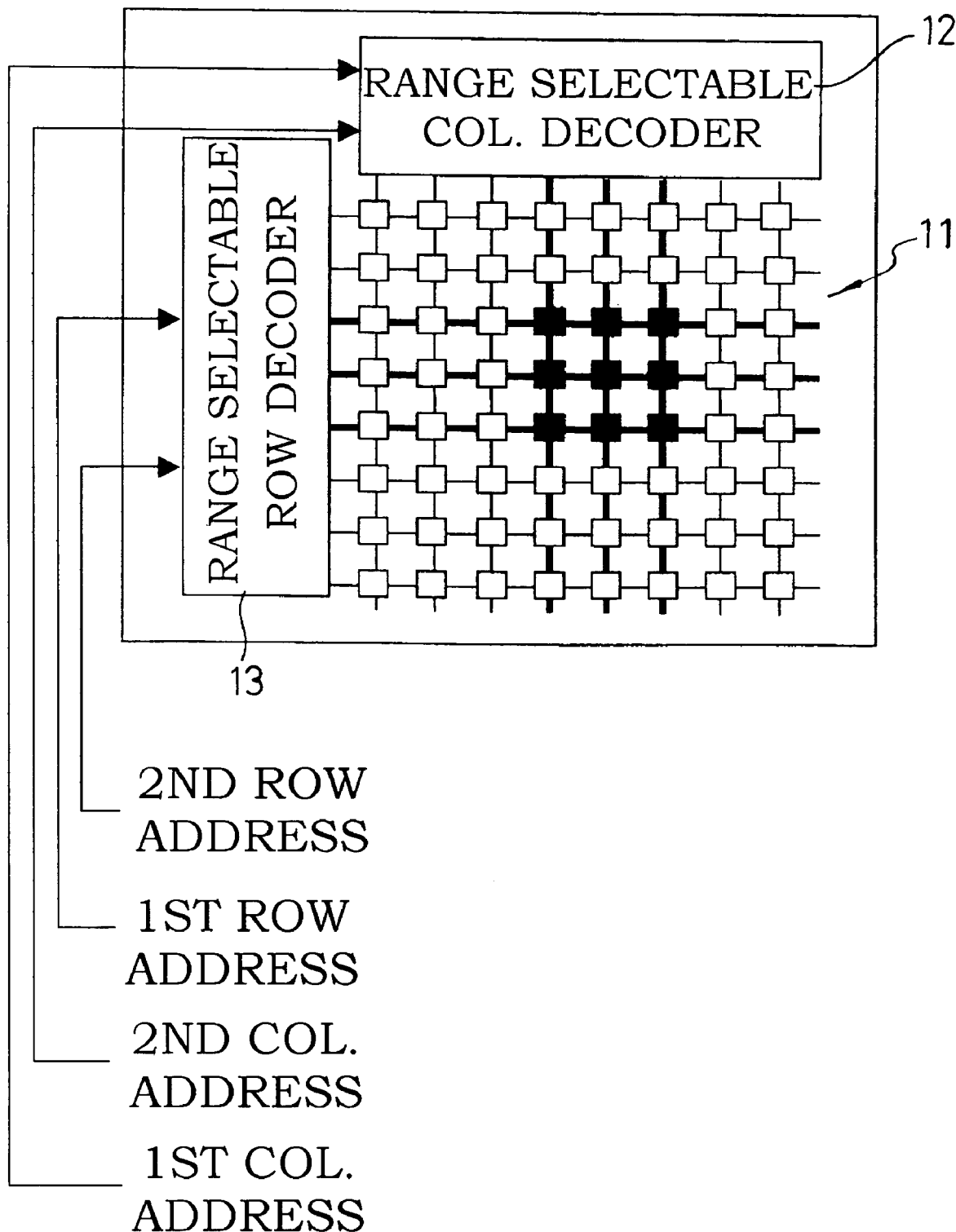
FIG. 2 is a configurational diagram schematically showing a frame memory device according to an embodiment of the present invention.

Referring to FIG. 2, a frame memory device according to an embodiment of the present invention, includes a number of memory cells 11 aligned in a matrix form; a range selectable column address decoder 12 for receiving first and second column addresses and generating at least one column address selection signal in order to designate at least one column address range with respect to the number of memory cells, and a range selectable row address decoder 13 for receiving first and second row addresses and generating at least one row address selection signal in order to designate at least one row address range with respect to the number of memory cells 11.

In the frame memory device according to the embodiment of the present invention shown in FIG. 2, the row and column address decoders 12 and 13 are formed of a range selectable decoder, respectively. The range selectable decoder receives two high and low addresses and generates an address selection signal that enables all memory cells located between the two addresses. In FIG. 2, four bold-typed memory cells are enabled.

In order to explain the concept of the range selectable address decoder, a simple example of a range selectable address decoder which receives a two-bit address for use in a 4×4 memory device will be described below. A 2-to-4 range selectable address decoder 20 according to a first embodiment of the present invention shown in FIG. 3, has a structure that first through sixth XOR gates 23a–23f process the outputs of the first and second decoders 21 and 22 formed of two general 2-to-4 decoders. Here, the 2-to-4 decoder can select one of four outputs with a two-bit input.

Except for the output of the most significant port among the outputs Q1–Q4 of the first decoder 21 and the outputs Q5–Q8 of the second decoder 22, the respective decoder outputs Q2–Q7 from the next upper port of the least significant port are connected to the respective one input of first through sixth gates 23a–23f, the outputs of first through fifth XOR gates 23a–23e are connected to the respective other input of the next XOR gates 23b–23f, and the least significant port output Q1 of the first decoder 21 is connected to the other input of the first XOR gate 23a.

In this case, the whole output addresses A0–A3 of the range selectable address decoder 20 are obtained from the least significant port output Q1, the second XOR gate 23b, the fourth XOR gate 23d and the sixth XOR gate 23f, in sequence from the lower address.

Figure 3:
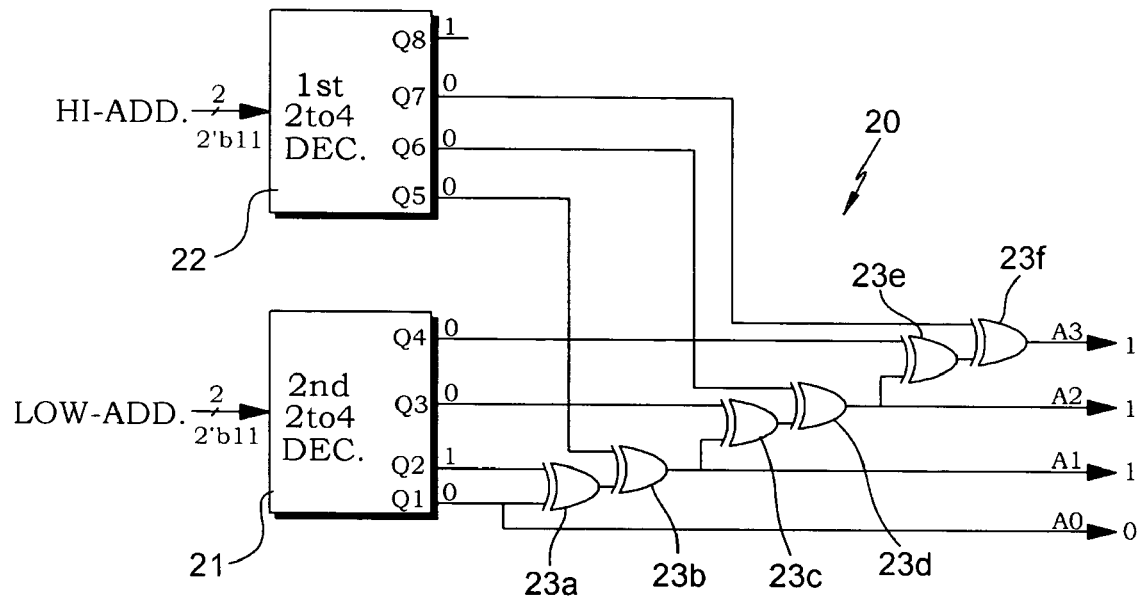
FIG. 3 is a detailed circuit diagram of a 2-to-4 range selectable address decoder according to a first embodiment of the present invention for use in a 4×4 memory device in order to easily explain the concept of a range selectable address decoder of FIG. 2.

The operation of the address decoder 20 will be described with reference to FIG. 3. If a value of a high address HI-ADD is for example, 2'b11, that is, $3_{10}$ ($3_{10}$ denotes 3 as a decimal number.), a value of a low address LOW-ADD is 2'b01, that is, $1_{10}$, the second decoder 22 to which a high address is applied outputs $1_2$ ($1_2$ denotes 1 of a binary number.) only at the port indicating 3, and the first decoder 21 to which a low address is applied outputs $1_2$ only at the port indicating 1.

These outputs pass through the first through sixth XOR gates 23a–23f. Accordingly, the finally output addresses A0–A3 output $1_2$ at all ports from the port meaning $1_{10}$ to the port meaning $3_{10}$. That is, all the ports of the output addresses A0–A3 within the range from a value of the low address LOW-ADD to a value of the high address HI-ADD are set $1_2$, and the other ports are all set to output $0_2$.

Figure 4:
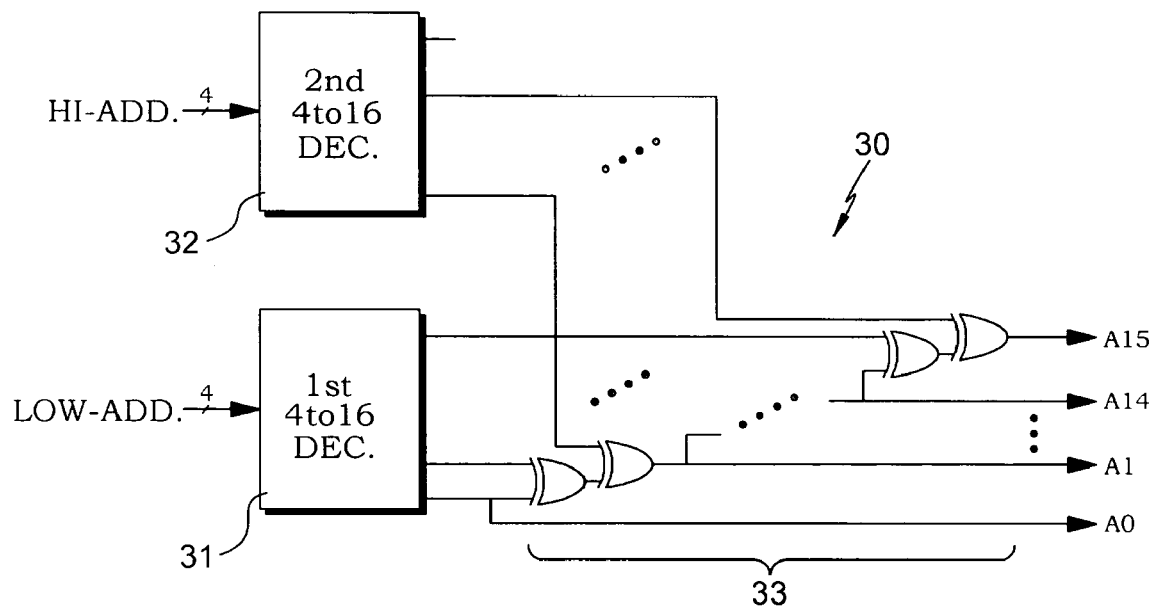
FIG. 4 is a detailed circuit diagram of a 4-to-16 range selectable address decoder according to a second embodiment of the present invention for use in a range selectable address decoder of FIG. 2.
Figure 4:
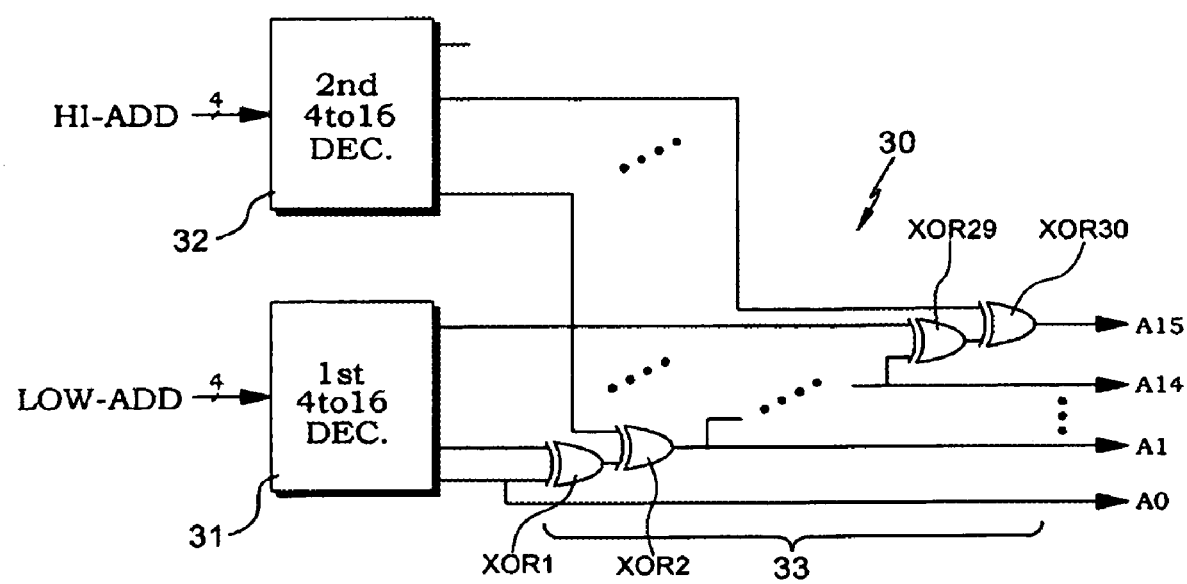

FIG. 4 shows a more extended range selectable address decoder 30 according to a second embodiment of the present invention, in which four bits are input as values of high and low addresses, respectively. Similarly to the first embodiment, the 4-to-16 range selectable address decoder 30 includes first and second decoders 31 and 32 formed of a 4-to-16 decoder, respectively, and first through thirtieth XOR gates 33 (XOR1, XOR2, . . . , X0R29 , and XOR30) for outputting output addresses A0, A1, . . . , A14, and A15.

As can be seen from FIG. 4, the number of bits in an input address is extended, and thus the number of XOR gates 33 increases. As a result, a propagation delay time taken from input to output increases, which causes a problem. That is, the number of serially connected XOR gates is $2*(2^N-1)$, in the case of an N-bit address. For example, in case of an 8-bit address, XOR gates of $2*(2^8-1)$ (i.e., 510) are connected in series. This may not guarantee a normal operation of a memory due to an increase of a propagation delay time in an address decoder.

Figure 5:
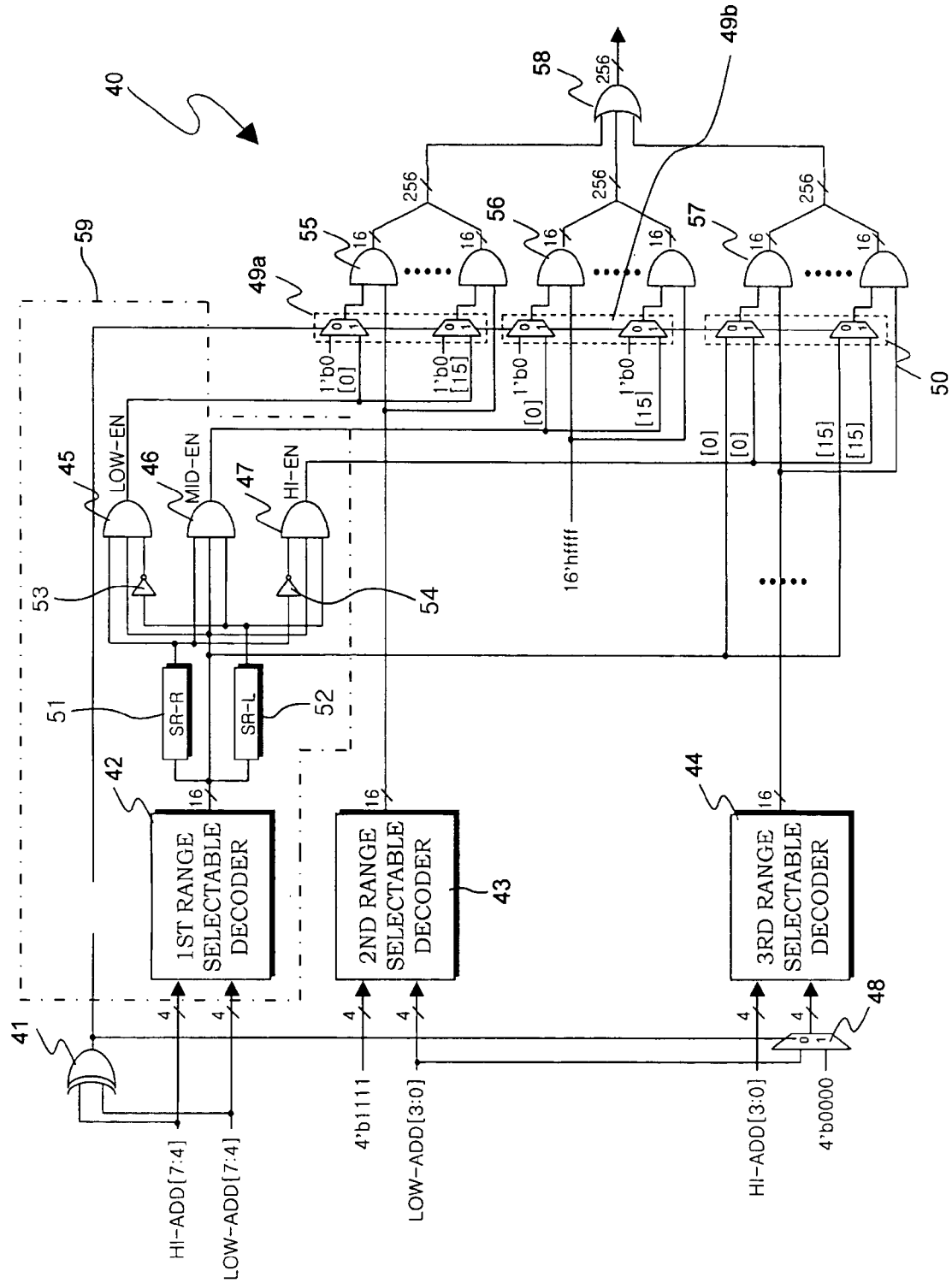
FIG. 5 is a detailed circuit diagram of a 8-to-256 range selectable address decoder according to a third embodiment of the present invention for use in a range selectable address decoder of FIG. 2.

FIG. 5 shows a range selectable address decoder 40 according to a third embodiment of the present invention in order to solve the above-described problem.

The range selectable address decoder 40 shown in FIG. 5 according to the third embodiment of the present invention is embodied by using first through third range selectable decoders 42–44 in which each range selectable decoder uses a 4-to-16 range selectable decoder. The first through third range selectable decoders 42–44 are embodied by separately using the four upper bits [7:4] and the four lower bits [3:0] of the two high and low addresses to select a common portion in case of an 8-bit address input.

The range selectable address decoder 40 according to the third embodiment of the present invention selects all output addresses within the range from a value of the low address LOW-ADD to a value of the high address HI-ADD, in a manner differing from those of the first and second embodiments.

Figure 6:
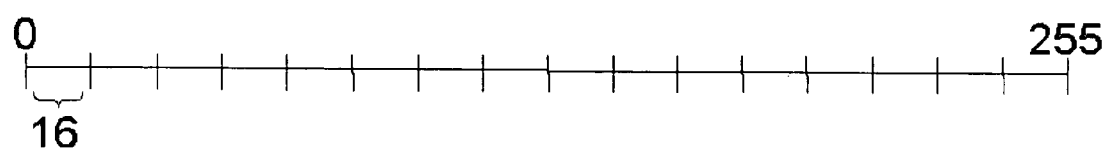
FIG. 6 is a diagram for explaining a unit group designation method which is applied when selecting a range of a range selectable address decoder according to the present invention.

That is, as shown in FIG. 6, the range selectable address decoder 40 according to the third embodiment of the present invention selects a corresponding group by the four upper bits [7:4] of the two high and low address inputs, respectively, in which the total 256 addresses A0–A255 are divided into 16 groups each being grouped in units of 16 addresses, selects a low address range among 16 addresses in the group selected by four lower bits [3:0] of the low address input, selects a high address range among 16 addresses in the group selected by four lower bits [3:0] of the high address input, and selects all addresses between the selected low and high addresses.

Figure 8:
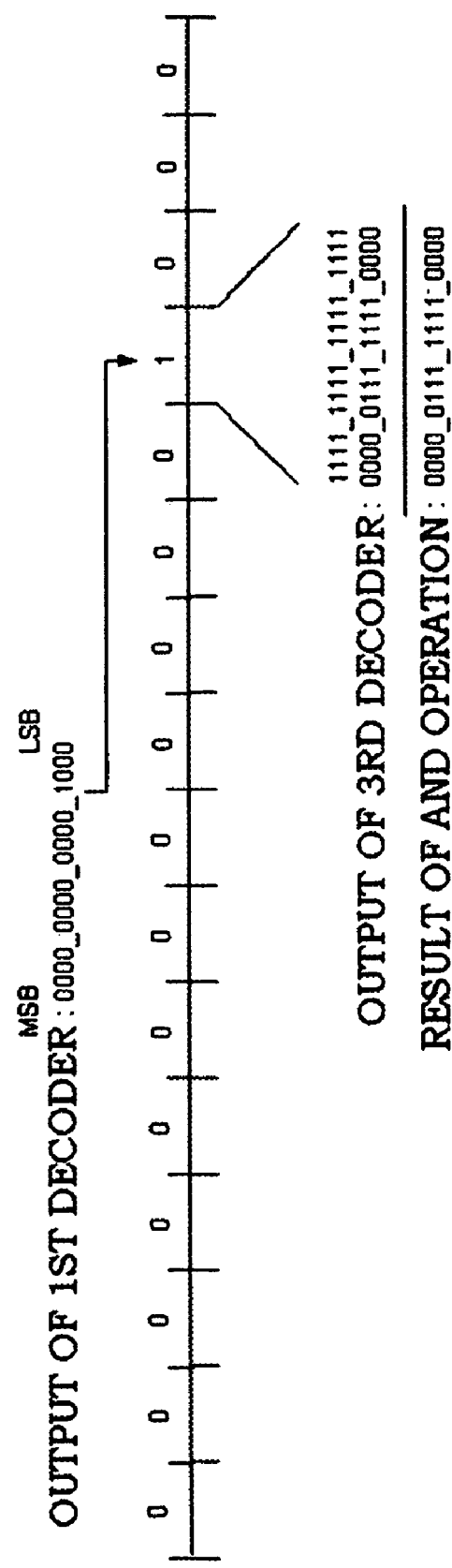
FIG. 8 is a diagram for explaining an address designation method within a selected unit group in the case that only one unit group is selected in a range selectable address decoder according to the present invention.

In the case that only one group have been selected in the result of having selected corresponding groups by the four upper bits [7:4] of the two high and low address inputs HI-ADD and LOW-ADD, all addresses between the low and high addresses selected by four lower bits [3:0] within the selected group are selected as shown in FIG. 8.

Figure 7:
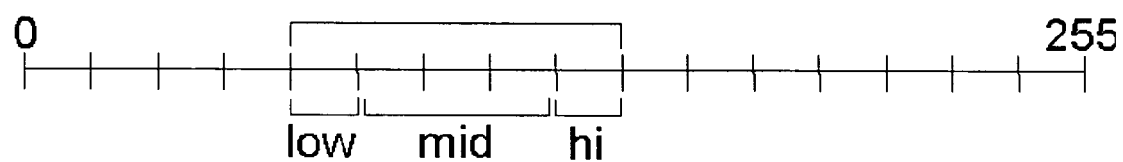
FIG. 7 is a diagram showing two or more unit group selections in a range selectable address decoder according to the present invention.
Figure 10:
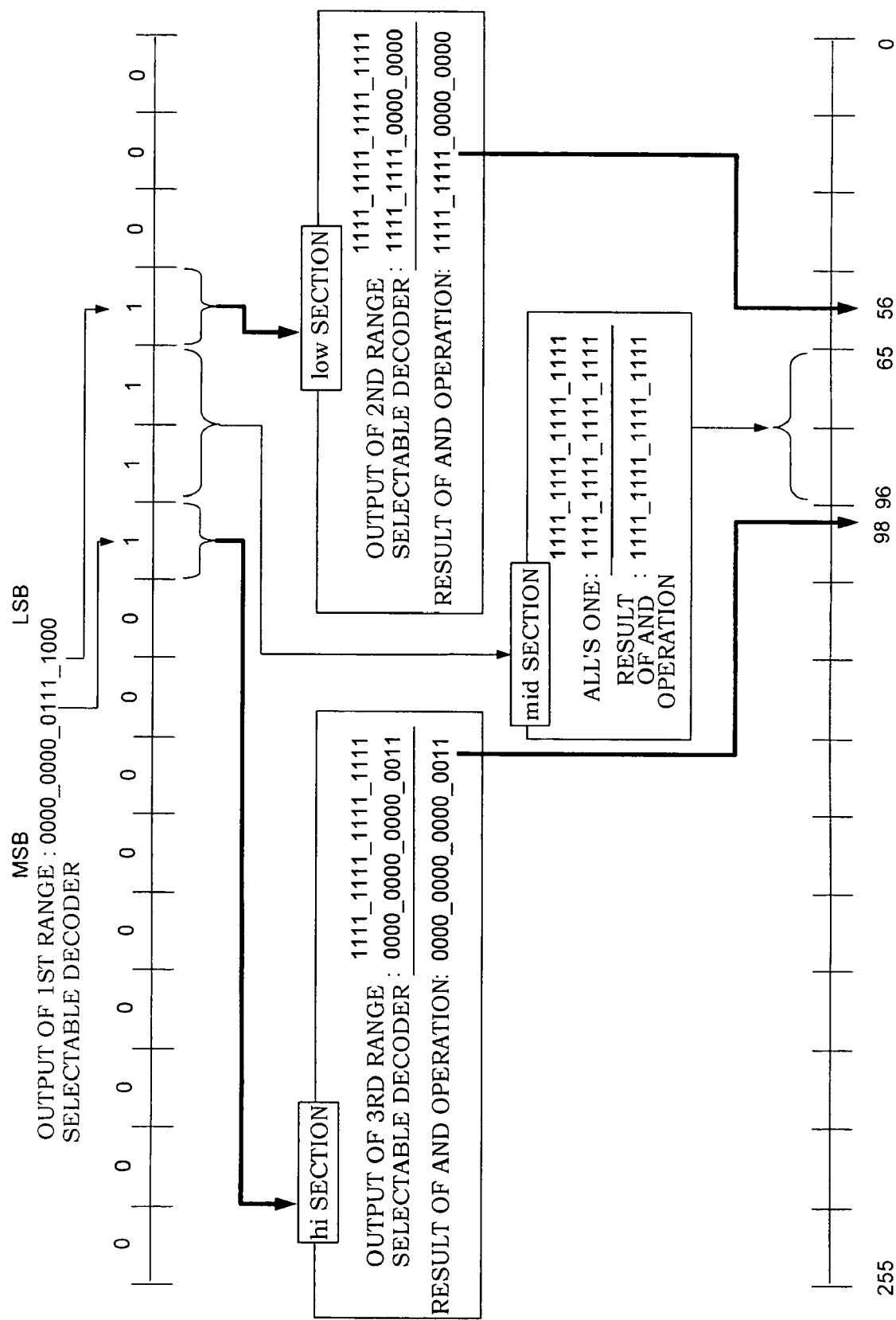
FIG. 10 is a diagram illustrating a signal processing step for overall address designation, in the case that two or more unit groups are selected in a range selectable address decoder according to the present invention.

However, in the case that two or more groups have been selected in the result of having selected corresponding groups by the four upper bits [7:4] of the two high and low address inputs HI-ADD and LOW-ADD, the selected groups are divided into a low group (low), a middle group (mid) and a high group (hi) as shown in FIGS. 7 and 10 in order to process the selected groups.

That is, in the case that a low group (low), a middle group (mid) and a high group (hi) have been selected by the four upper bits [7:4] of the two high and low address inputs, a low address value is selected among 16 addresses in the group selected by four lower bits [3:0] of the row address input in the case of the low group (low), a high address value is selected among 16 addresses in the group selected by four lower bits [3:0] of the high address input in the case of the high group (hi), and all addresses in the group are output as $1_2$, and are selected between the selected low and high addresses in the case of the middle group (mid) between the low group (low) and the high group (hi).

The range selectable address decoder 40 according to the third embodiment of the present invention judges whether or not one group or two or more groups are selected by the two high and low address inputs, by using an XOR gate 41.

The XOR gate 41 receives the respective four upper bits [7:4] of the two high and low address inputs HI-ADD and LOW-ADD, and then judges whether or not the four upper bits [7:4] of the two high and low address inputs are same one another. If the four upper bits [7:4] of the two high and low address inputs are same one another, the XOR gate 41 generates an output of $0_2$ to then select only one group, but if the four upper bits [7:4] of the two high and low address inputs are not same one another, the XOR gate 41 generates an output of $1_2$ to then select a number of corresponding groups, to thereby generate a group enable signal.

The range selectable address decoder 40 also includes a group selection circuit 59 for selecting a corresponding low group (low), a corresponding middle group (mid), and a corresponding high group (hi), when two or more groups are selected by using the respective four upper bits [7:4] of the two high and low address inputs applied to the XOR gate 41.

The group selection circuit 59 includes: a first range selectable decoder 42 for selecting a range value between two address inputs when four upper bits of each of two high and low address inputs are input [7:4] thereto; a right shift register (SR-R) 51 for shifting the output of the first range selectable decoder 42 by one bit to the right; a left shift register (SR-L) 52 for shifting the output of the first range selectable decoder 42 by one bit to the left; a first inverter 53 for inverting the output of the right shift register 51; a second inverter 54 for inverting the output of the left shift register 52; a low enable signal generator 45 formed of an AND gate in order to generate a low enable signal LOW-EN which selects and enables a low group (low) in combination with the output of the right shift register 51, the output of the first range selectable decoder 42, and the output of the first inverter 53; a middle enable signal generator 46 formed of an AND gate in order to generate a middle enable signal MID-EN which selects and enables a middle group (mid) in combination with the output of the right shift register 51, the output of the first range selectable decoder 42, and the output of the left shift register 52; and a high enable signal generator 47 formed of an AND gate in order to generate a high enable signal HI-EN which selects and enables a high group (hi) in combination with the output of the second inverter 54, the output of the first range selectable decoder 42, and the output of the left shift register 52.

The range selectable address decoder 40 also includes a second range selectable decoder 43 which receives 4'b1111 and four lower bits of a low address input value in order to select a low address value among 16 addresses in the low group selected by the four lower bits [3:0] of the low address input; and a third range selectable decoder 44 which receives 4'b0000 and four lower bits of a high address input value in order to select a high address value among 16 addresses in the high group selected by the four lower bits [3:0] of the high address input, in a manner that the addresses of the selected low group (low), middle group (mid) and the high group (hi) can be designated.

A first multiplexer 48 for selectively outputting any one input among the four lower bits [3:0] of the low address input and the 4'b0000 is provided to the input stage of the third range selectable decoder 44, according to an output of the XOR gate 41.

If only one group has been selected by the XOR gate 41, an output of $0_2$ is applied to the first multiplexer 48, and thus the four lower bits [3:0] of the low address input is output to the third range selectable decoder 44. Meanwhile, if a plurality of groups have been selected by the XOR gate 41, an output of $1_2$ is applied to the first multiplexer 48, and thus 4'b0000 is output to the third range selectable decoder 44.

The output of the second range selectable decoder 43 is applied to each one input of a first AND gate group 55 including 16 AND gates, and the output of the third range selectable decoder 44 is applied to each one input of a third AND gate group 57 including 16 AND gates. Also, in the middle group, in order to output $1_2$ (all's one) as all outputs so that all addresses are selected between the selected low and high addresses, 16'hffff is applied to each one input of a second AND gate group 56 including 16 AND gates.

Also, second through fourth multiplexer groups 49a, 49b, and 50 which include 16 multiplexers are connected to the other inputs of the first through third AND gate groups 55, 56, and 57, respectively. Also, in order to select an output of the multiplexer groups 49a, 49b, and 50, the output of the XOR gate 41 is commonly connected to the multiplexer groups 49a, 49b, and 50.

1'b0 is applied to one input terminal of the second multiplexer group 49a, and a low enable signal LOW-EN of the low enable signal generator 45 is applied to the other input terminal thereof. Also, 1'b0 is applied to one input terminal of the third multiplexer group 49b, and a middle enable signal MID-EN of the middle enable signal generator 46 is applied to the other input terminal thereof. Also, the output of the first range selectable decoder 42 of the middle enable signal generator 42 is applied to one input terminal of the fourth multiplexer group 50, and a high enable signal HI-EN of the high enable signal generator 47 is applied to the other input terminal thereof.

The respective outputs of the first through third AND gate groups 55, 56, and 57 are logically summed in an OR gate 58.

The function of the 8-to-256 range selectable address decoder 40 according to the third embodiment of the present invention will be described below in detail.

First, the output of the first range selectable decoder 42 by the four upper bits is classified into the following two cases.

A) First Case that Only One Group is Selected by the Four Upper Bits

When the values of the four upper bits [7:4] of the two high and low address inputs HI-ADD and LOW-ADD are same each other, only one group is selected. Here, the output of the XOR gate 41 becomes zero ($0_2$). In this case, the zero port input values are output from all the outputs of the first multiplexer 48, and second through fourth multiplexer groups 49a, 49b and 50.

Hereinbelow, an example will be described.

If a high address HI-ADD is $0011\_1010_2$, and a low address LOW-ADD is $0011\_0100_2$, the output of the first range selectable decoder 42 becomes $0000\_0000\_0000\_1000_2$, the output of the third range selectable decoder 44 becomes $0000\_0111\_1111\_0000_2$. Here, all the outputs of the second and third multiplexer groups 49a and 49b become zeroes ($0_2$), and thus all the outputs of the first and second AND gate groups 55 and 56 become zeroes (256'b0). At the same time, the output of the fourth multiplexer group 50 is obtained by logically AND-ing, that is, logically multiplying the output of the first range selectable decoder 42, that is, each one bit of $0000\_0000\_0000\_1000_2$ and the output of the third range selectable decoder 44, that is, 16 bits in the third AND gate group 57 including 16 AND gates, to accordingly output the value of 256 bits.

That is, as shown in FIG. 8, only fourth group is enabled among 16 groups by the output ($0000\_0000\_0000\_1000_2$) of the first range selectable decoder 42, and all the outputs of the other groups become zeroes. That is, only fourth AND gate is enabled among the 16 AND gates in the third AND gate group 57 and the outputs of the other 15 AND gates are set zero (0).

Also, in the case of fourth AND gate, the output ($0000\_0111\_1111\_0000_2$) of the third range selectable decoder 44 is ANDed, that is, logically multiplied with the other input ($1111\_1111\_1111\_1111$), to thus output the output of the third range selectable decoder 44 as it is.

That is, in the case of the output of the final OR gate 58, only output bits corresponding to a range between a high address input value $0011\_1010_2$, i.e., $58_{10}$ and a low address input value $0011\_0100_2$, i.e., $52_{10}$ are output as $1_2$, and all the remaining output bits are output as zeroes ($0_2$). Thus, it can be seen that all addresses present within a range from 52 to 58 are designated.

B) Second Case that Two or More Groups are Selected by Four Upper Bits

When the values of the four upper bits [7:4] of the two high and low address inputs are not same each other, two or more groups are selected. Here, if the output of the XOR gate 41 becomes one ($1_2$), two or more groups are selected in the result of selecting groups. In this case, as shown in FIGS. 7 and 10, the groups are divided into a low group (low), a middle group (mid) and a high group (hi), and then divided groups are processes.

Hereinbelow, an example will be described.

If the output of the XOR gate 41 becomes $1_2$, all the outputs of the first multiplexer 48 and the second through fourth multiplexer groups 49a, 49b and 50 become the 1 port input values.

Thus, if a high address HI-ADD is $0110\_0010_2$ ($98_{10}$), and a low address LOW-ADD is $0011\_1000_2$ ($56_{10}$), the output of the first range selectable decoder 42 becomes $0000\_0000\_0111\_1000_2$, and the four lower bits $1000_2$ of the low address LOW-ADD and four bits $1111_2$ are input to the second range selectable decoder 43 to thus output $1111\_1111\_0000\_0000_2$. Also, the input of the third range selectable decoder 44 is composed of the four lower bits $0010_2$ of the high address HI-ADD and four bits $0000_2$, to thus output $0000\_0000\_0000\_0011_2$.

In order to enable the selected low group (low), middle group (mid) and high group (hi), the first range selectable decoder 42 in the group selection circuit 59 performs a signal processing of the $0000\_0000\_0111\_1000_2$ obtained by the four upper bits of the two input addresses as shown in FIGS. 9A through 9C.

First, as shown in FIG. 9A, a low enable signal LOW-EN for selecting and enabling a low group (low) is obtained as $0000\_0000\_0000\_1000_2$ which is output from the low enable signal generator 45 which logically ANDs $0000\_0000\_0011\_1100_2$ (Shift Right) which is obtained by shifting the output of the first range selectable decoder 42 by one bit to the right in the right shift register 51 (SR-R), the output $0000\_0000\_0111\_1000_2$ of the first range selectable decoder 42, and $1111\_1111\_0000\_1111_2$ (~Shift Left) which is obtained by shifting the output of the first range selectable decoder 42 by one bit to the left in the left shift register 52 (SR-L) and then inverting the shifted result in a first inverter 53.

The value of $0000\_0000\_0000\_1000_2$ (LOW-EN) which is output from the low enable signal generator 45 means enabling of the fourth group.

Similarly to the above low group, as shown in FIG. 9B, a middle enable signal MID-EN for selecting and enabling a middle group (mid) is obtained as $0000\_0000\_0011\_0000_2$ which is output from the middle enable signal generator 46 which logically ANDs the output $0000\_0000\_0111\_1000_2$ of the first range selectable decoder 42, $0000\_0000\_0011\_1100_2$ (Shift Right) which is obtained by shifting the output of the first range selectable decoder 42 by one bit to the right in the right shift register 51, and $0000\_0000\_1111\_0000_2$ (~Shift Left) which is obtained by shifting the output of the first range selectable decoder 42 by one bit to the left in the left shift register 52.

The value of $0000\_0000\_0011\_0000_2$ (Min-EN) which is output from the middle enable signal generator 46 means enabling of the fifth and sixth groups.

Also, similarly to the above low and middle groups, as shown in FIG. 9C, a high enable signal HI-EN for selecting and enabling a high group (hi) is obtained as $0000\_0000\_0100\_0000_2$ which is output from the high enable signal generator 47 which logically ANDs the output $0000\_0000\_0111\_1000_2$ of the first range selectable decoder 42, $1111\_1111\_1100\_0011_2$ (Shift Right) which is obtained by shifting the output of the first range selectable decoder 42 by one bit to the right in the right shift register 51, and then inverting the shifted result in a second inverter 54, and $0000\_0000\_1111\_0000$ (~Shift Left) which is obtained by shifting the output of the first range selectable decoder 42 by one bit to the left in the left shift register 52.

The value of $0000\_0000\_0100\_0000_2$ (HI-EN) which is output from the high enable signal generator 47 means enabling of the seventh group.

In case of the high group (hi), a high address value is selected among 16 addresses in the group selected by the four lower bits [3:0] of the high address HI-ADD. In case of the middle group (mid) between the low group (low) and the high group (hi), all addresses in the middle group (mid) are output as $1_2$ so that all addresses between the selected low and high addresses are selected.

A value output from each selected group will be described below with reference to FIG. 10.

First, in case of the low group (low), a low address value is selected among 16 addresses in the group selected by the four lower bits [3:0] of the low address LOW-ADD.

As described above, since an input value of 1 port is output from the second multiplexer group 49a, one bit of $1111\_1111\_1111\_1111_2$ is applied as a low enable signal LOW-EN to each one input terminal of the first AND gate group 55 formed of 16 AND gates, and $1111\_1111\_0000\_0000_2$ which is the output of the second range selectable decoder 43 is applied to all the other input terminals of the first AND gate group 55. Accordingly, a value output from the first AND gate group 55 formed of 16 AND gates is as a low group output as follows: 56th to 64th bits are all $1_2$ (one), and the other bits are all $0_2$ (zero).

In case of the high group (hi), a high address value is selected among 16 addresses in the group selected by the four lower bits [3:0] of the high address HI-ADD.

In this case, since an input value of 1 port is output from the fourth multiplexer group 50, one bit of $1111\_1111\_1111\_1111_2$ is applied as a high enable signal HI-EN to each one input terminal of the third AND gate group 57 formed of 16 AND gates, and $0000\_0000\_0000\_0011_2$ which is the output of the third range selectable decoder 44 is applied to all the other input terminals of the third AND gate group 57. Accordingly, a value output from the third AND gate group 57 formed of 16 AND gates is as a high group output as follows: 97th and 98th bits are all $1_2$ (one), and the other bits are all $0_2$ (zero).

Also, in case of the middle group, all addresses between the selected low and high addresses, and then $1_2$ (all's one) is output for all output terminals thereof. For this purpose, one bit of $1111\_1111\_1111\_1111_2$ is applied as a middle enable signal MID-EN to each one input terminal of the second AND gate group 56 formed of 16 AND gates, and 16'hffff, that is, $1111\_1111\_1111\_1111_2$ is applied to all the other input terminals of the second AND gate group 56. Accordingly, a value of $1111\_1111\_1111\_1111_2$ output from the second AND gate group 56 formed of 16 AND gates is as a middle group output as follows: 65th to 96th bits are all $1_2$ (one), and the other bits are all $0_2$ (zero).

Thus, 56th through 98th bits of an OR operation output of the first through third AND gate groups 55 to 57 are all $1_2$ (one), and the other bits are all $0_2$ (zero), in which only output bits corresponding to a range between a high address input value $0110\_0010_2$ ($98_{10}$) and a low address input value $0011\_1000_2$ ($56_{10}$) becomes 1, and all the other output bits become 0.

Figure 11A:
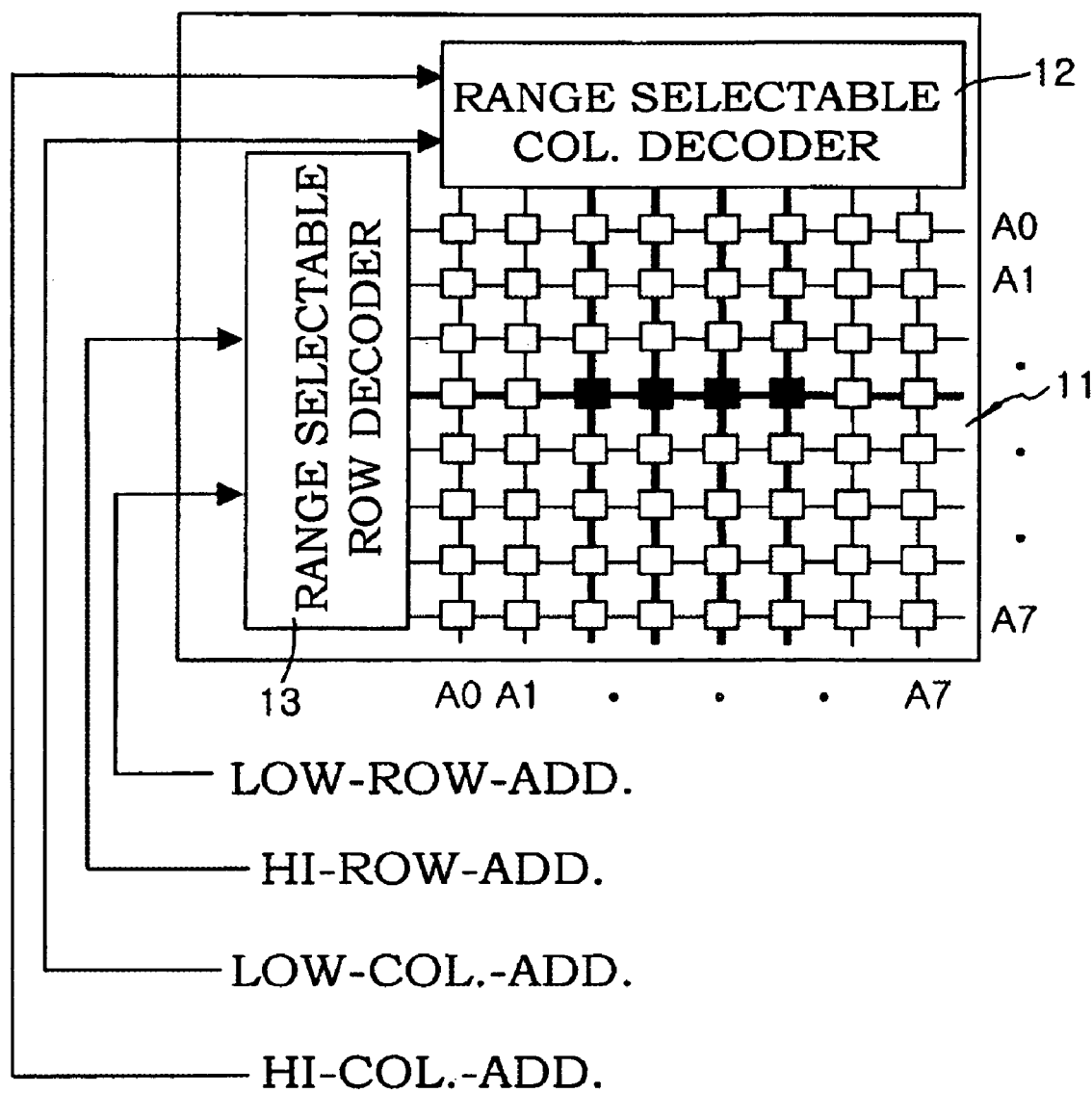
FIGS. 11A through 11C show examples of graphic data which can be embodied by using a frame memory device according to a first embodiment of the present invention.
Figure 11B:
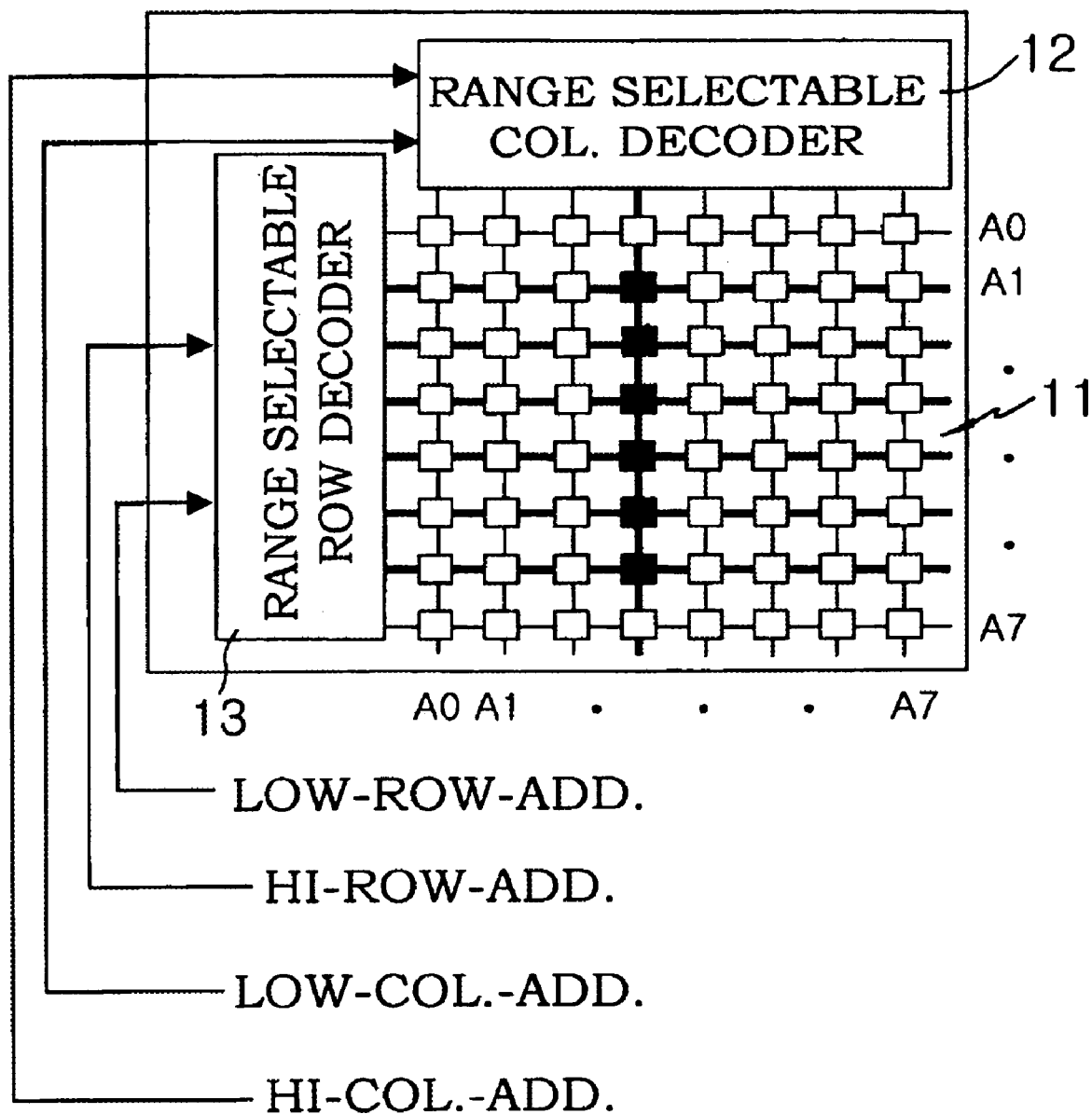
Figure 11C:
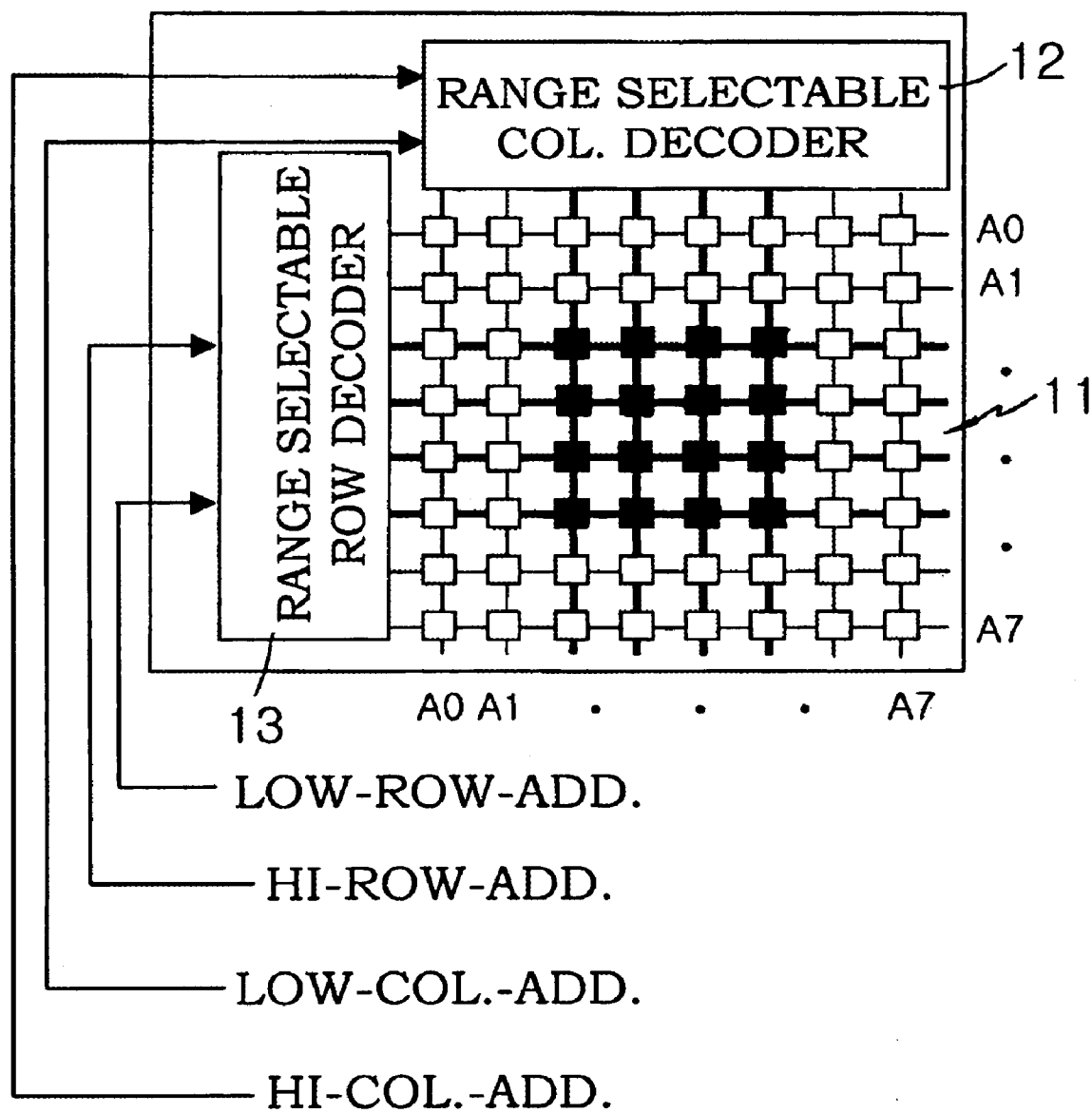

An example of graphics which can be realized by using the frame memory device according to a first embodiment of the present invention will be described below with reference to FIGs. 11A through 11C. In FIGS.11A through 11C, reference characters A0, A1, ..., A7 designate column and row addresses in the frame memory device.

FIG. 11A illustrates an example of drawing a straight line which is parallel with the X-axis. In this case, if the lower limit value and upper limit values on a desired straight line, for example, 3 and 6 are designated as low and high column addresses HI-COL-ADD and LOW-COL-ADD applied to the range selectable column address decoder 12, respectively and a single value, for example, 4 is designated as low and high row addresses HI-ROW-ADD and LOW-ROW-ADD applied to the range selectable row address decoder 13, a straight line parallel with the X-axis is represented as illustrated in FIG. 11A.

FIG. 11B illustrates an example of drawing a straight line which is parallel with the Y-axis. In this case, if the lower limit value and upper limit values on a desired straight line, for example, 2 and 7 are designated as low and high column addresses HI-ROW-ADD and LOW-ROW-ADD applied to the range selectable row address decoder 13, respectively and a single value, for example, 4 is designated as low and high column addresses HI-COL-ADD and LOW-COL-ADD applied to the range selectable column address decoder 12, a straight line parallel with the Y-axis is represented as illustrated in FIG. 1B.

FIG. 11C illustrates an example of drawing a rectangle filled with color. In the case that such a rectangle filled with color is drawn, if the lower limit value and upper limit values in a column range of a desired rectangle, for example, 3 and 6 are designated as low and high column addresses HI-COL-ADD and LOW-COL-ADD applied to the range selectable column address decoder 12, respectively and the lower limit value and upper limit values in a column range of a desired rectangle, for example, 3 and 6 are designated as low and high row addresses HI-ROW-ADD and LOW-ROW-ADD applied to the range selectable row address decoder 13, a graphic processing of a square or rectangle space can be performed all at a time as illustrated in FIG. 11C.

Since each writing can be performed all at a time in the graphic processing of the above-described examples, the present invention enables higher-speed processing incomparably with a conventional memory architecture which requires writing as many as the number of memories. As a result, since a graphic processing circuit located in a preceeding stage of the memory need not await until a writing operation finishes, the structure of the graphic processor can be simplified.

The frame memory device according to the first embodiment of the present invention can be used for a frame memory having a 256×256 memory capacity since column and row decoders receive an 8-bit input and output 256 address outputs, respectively.

Also, the frame memory device according to the first embodiment of the present invention is embodied by using range selectable decoders as column and row address decoders.

However, in the case that a general address decoder which can designate two address lines by high and low addresses is combined with the range selectable decoder, the following two straight lines can be writable all at a time.

Figure 12:
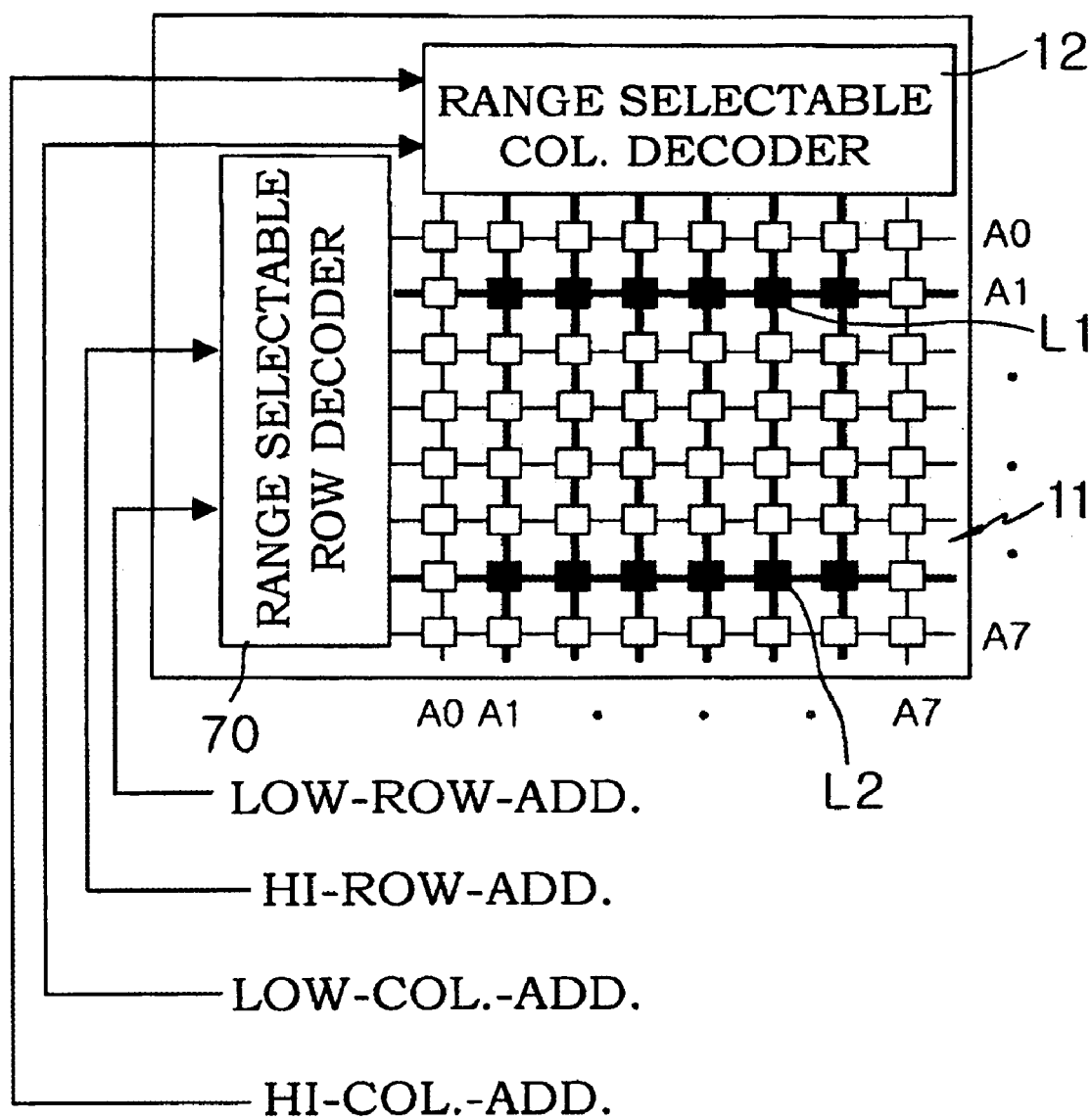
FIG. 12 is a configurational view schematically showing a frame memory device according to a second embodiment of the present invention.

FIG. 12 is a configurational view schematically showing a frame memory device according to a second embodiment of the present invention. In FIG. 12, reference characters A0, A1, ..., A7 designate column and row addresses in the frame memory device.

A frame memory device according to a second embodiment of the present invention, includes: a number of memory cells 11 aligned in a matrix form; a range selectable column address decoder 12 for receiving high and low column addresses and generating at least one column address selection signal in order to designate at least one column address range with respect to the number of memory cells 11; and a general purpose address decoder 70 for receiving high and low row addresses and generating two row address selection signals in order to designate two row addresses with respect to the number of memory cells 11.

Figure 15:
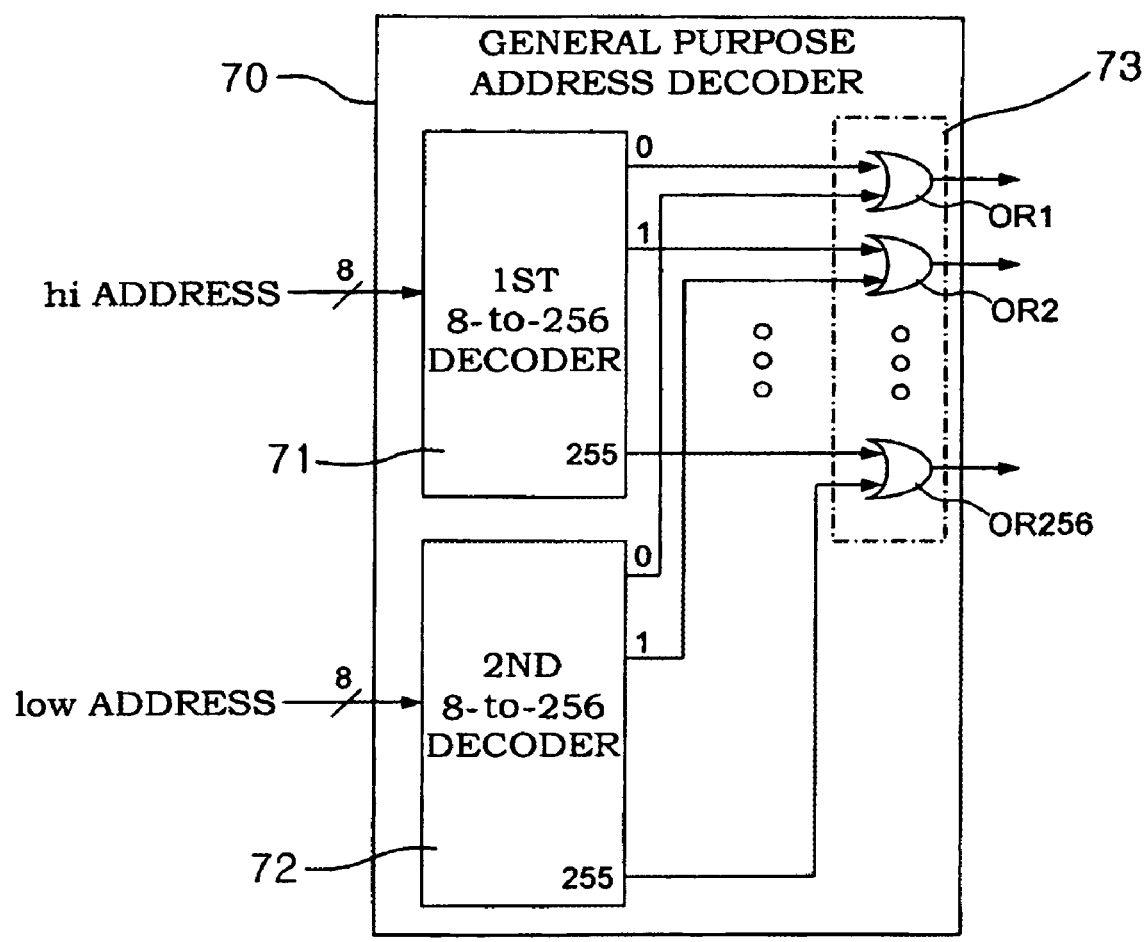
FIG. 15 is a detailed circuit diagram of a general purpose address decoder which is used in frame memory devices according to second through fourth embodiments of the present invention, respectively.

As shown in FIG. 15, the address decoder 70 receives two high and low addresses and generates two address selection signals which can enable all memory cells located on the two address lines. In FIG. 12, the memory cells on two bold-styled lines are enabled.

The general purpose address decoder 70 includes: first and second general purpose 8-to-256 decoders 71 and 72 enabling one output among 256 outputs when 8-bit high and low addresses are input thereto; and 256 OR gates 73 (OR1, OR2, ..., OR256) for logically summing the outputs of an identical level from the first and second 8-to-256 decoders 71 and 72.

Thus, since the general purpose address decoder 70 generates a decoder output enabling one output among 256 outputs when 8-bit high and low addresses are input to the first and second 8-to-256 decoders 71 and 72, and the outputs of the first and second 8-to-256 decoders 71 and 72 are logically summed in the 256 OR gates 73 (OR1, OR2, ..., OR256), the outputs of the two decoders 71 and 72 are generated as row addresses.

Thus, in the frame memory device according to the second embodiment of the present invention having the above-described decoder structure, memory cells are designated between a low column address and a high column address which are designated by the range selectable column decoder 12 on two row lines designated from the general purpose address decoder 70 according to the 8-bit high and low row address inputs, to thereby write data. That is, two parallel lines L1 and L2 which are parallel with the X-axis can be drawn by a single writing operation.

Figure 13:
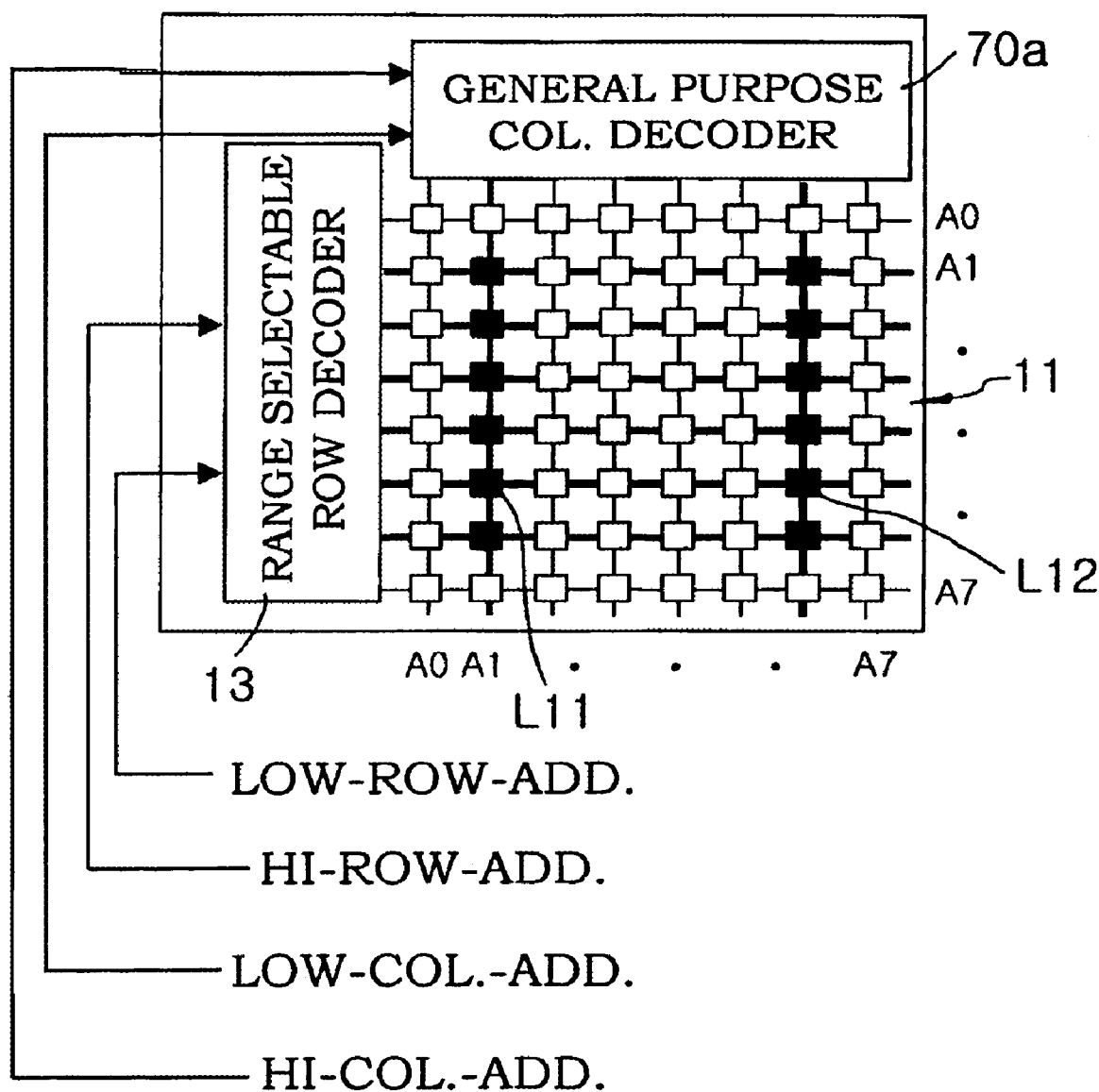
FIG. 13 is a configurational view schematically showing a frame memory device according to a third embodiment of the present invention.

FIG. 13 is a configurational view schematically showing a frame memory device according to a third embodiment of the present invention. In FIG. 13, reference characters A0, A1, ..., A7 designate column and row addresses in the frame memory device. The third embodiment is similar to the second embodiment. In the third embodiment, a range selectable address decoder is used as a row address decoder. That is, a general purpose address decoder shown in FIG. 15 is used as a column address decoder structure.

Thus, in the frame memory device according to the third embodiment of the present invention having the above-described decoder structure, memory cells are designated between a low row address and a high row address which are designated by the range selectable row decoder 13 on two column lines designated from the general purpose address decoder 70a according to the 8-bit high and low column address inputs, to thereby write data. That is, two parallel lines L11 and L12 which are parallel with the Y-axis can be drawn by a single writing operation.

Figure 14:
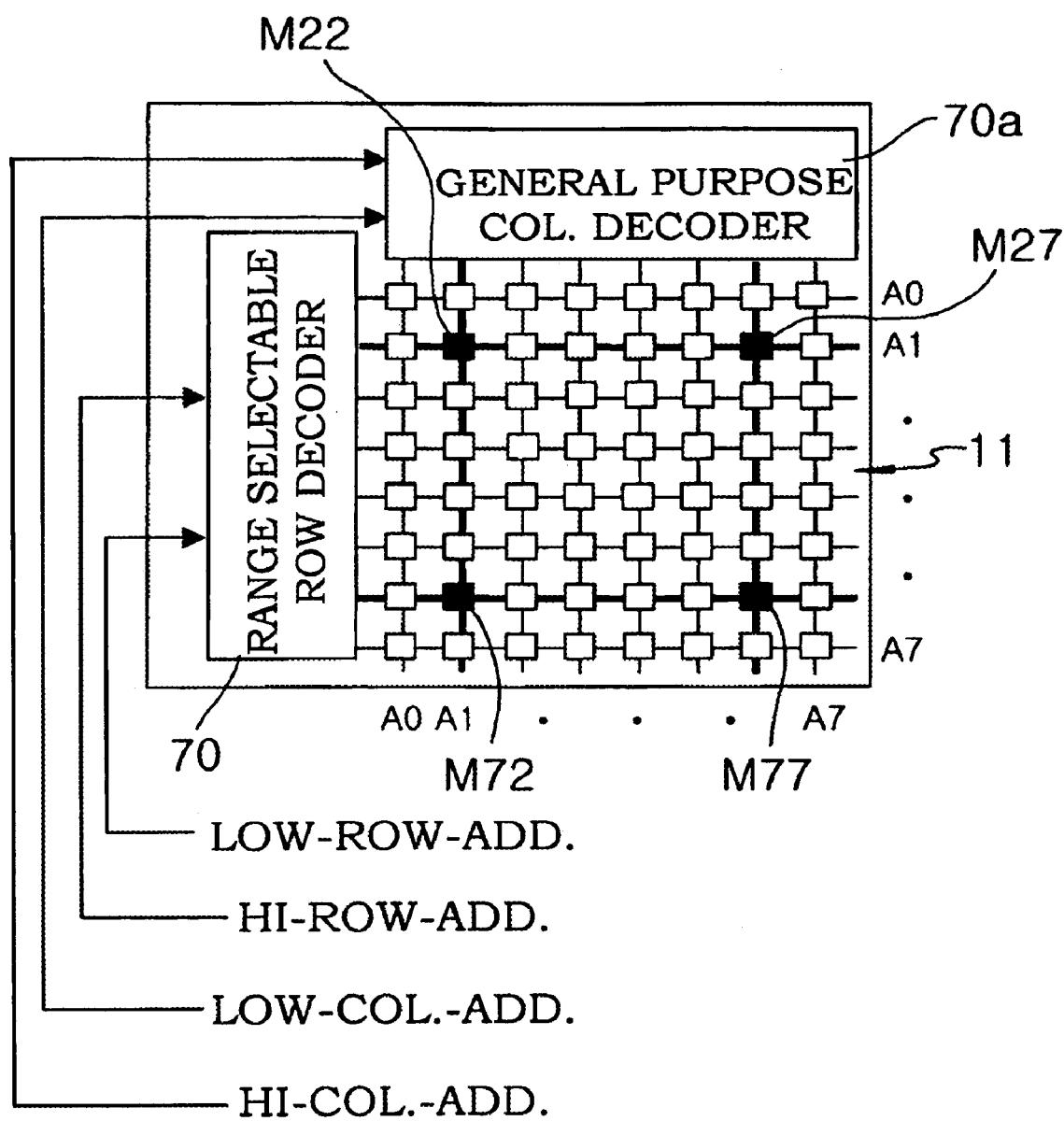
FIG. 14 is a configurational view schematically showing a frame memory device according to a fourth embodiment of the present invention.

FIG. 14 is a configurational view schematically showing a frame memory device according to a fourth embodiment of the present invention. In FIG. 14, reference characters A0, A1, . . . , A7 designate column and row addresses in the frame memory device. In the frame memory device according to the fourth embodiment of the present invention, a general purpose decoder shown in FIG. 15 is used as column and row address decoders 70a and 70.

Thus, in the frame memory device according to the fourth embodiment of the present invention having the above-described decoder structure, four memory cells are designated at four points where two row lines designated from the general purpose address decoder 70 according to the 8-bit high and low row address inputs and two column lines designated from the general purpose address decoder 70a according to the 8-bit high and low column address inputs, cross each other, to thereby write data. That is, four memory cells M22, M27, M72, and M77 corresponding to the four vertices of a rectangle can be drawn by a single writing operation.

Figure 1:
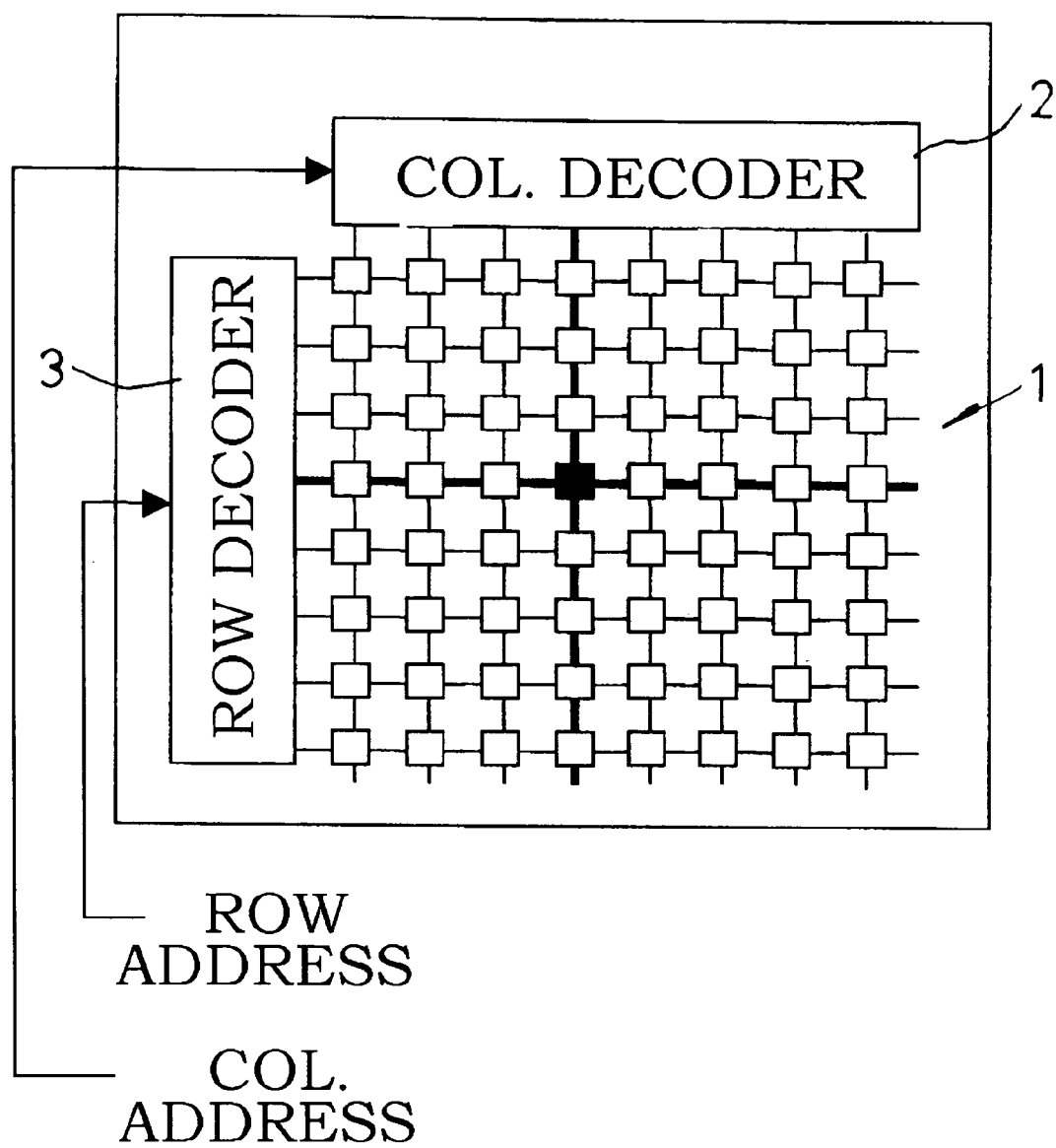
FIG. 1 is a configurational diagram schematically showing a conventional memory device for processing graphic data.

Thus, the second through fourth embodiments are inferior to the first embodiment, but superior to the conventional memory device shown in FIG. 1, since high-speed graphic data processing can be performed through writing of data into a number of memory cells relatively all at a time.

Thus, high-speed graphic data processing in a cellular phone or a PDA can be performed through a memory structure of the present invention. As a LCD panel is evolving from STN to an organic EL (OLED) through RFT, the present invention provides a very useful effect.

In the above-described embodiments, the frame memory device having 256×256 memory cells have been described with respect to the case that the high and low addresses are 8 bits at maximum. It can be easily understood by one skilled in the art that the present invention is not limited thereto, but can be applied to a memory device having a more memory capacity by extending the number input bits of a range selectable decoder.

As described above, a range selectable address decoder and a frame memory device using the same according to the present invention can reduce a burden of a processor in a variety of portable terminals having limited capacities, by processing graphic data at high speed, in which row/column address decoders capable of designating addresses of a desired range by two addresses are used, to thereby select a number of memory cells of a desired range all at a time and write data in the selected memory cells.

Thus, the present invention can be applied to all kinds of fields of a portable terminal such as a cellular phone and a PDA which include a technology of storing graphic data necessary for high-speed graphic processing into a frame memory.

As described above, the present invention has been described with respect to particularly preferred embodiments. However, the present invention is not limited to the above embodiments, and it is possible for one who has an ordinary skill in the art to make various modifications and variations, without departing off the spirit of the present invention.

What is claimed is:

1. A frame memory device comprising:
   a number of memory cells aligned in a matrix form;
   a range selectable column address decoder for receiving first and second column addresses and generating at least one successive column address selection signal in order to designate at least one successive column address range with respect to the number of memory cells; and
   a range selectable row address decoder for receiving first and second row addresses and generating at least one successive row address selection signal in order to designate at least one successive row address range with respect to the number of memory cells,
   wherein a graphic data write operation is accomplished all at a time with respect to the number of memory cells selected by the at least one successive column address selection signal and the at least one successive row address selection signal.

2. The frame memory device of claim 1, wherein if the first and second column addresses equal each other and the first and second row addresses do not equal each other, a number of memory cells are selected on a single straight line parallel with the Y-axis corresponding to the successive addresses between the first and second row addresses, and if the first and second row addresses equal each other and the first and second column addresses do not equal each other, a number of memory cells are selected on a single straight line parallel with the X-axis corresponding to the successive addresses between the first and second column addresses.

3. The frame memory device of claim 1, wherein if the first and second column addresses do not equal each other and the first and second row addresses do not equal each other, all memory cells are selected in a rectangle corresponding to the successive addresses between the first and second column addresses and the successive addresses between the first and second row addresses.

4. The memory device of claim 1, wherein the range selectable column address decoder and the range selectable row address decoder perform selection of an address of a successive range, respectively, in which the total 256 addresses are divided into 16 groups in the case that the first and second column addresses and the first and second row addresses are 8-bit signals, respectively, a corresponding group by respective four upper bits of the first and second address inputs in units of 16 addresses, a low address range is selected among 16 addresses in the group selected by four lower bits of the low address input among the first and second addresses, a high address range is selected among 16 addresses in the group selected by four lower bits of the high address input among the first and second addresses, and all successive addresses are selected between the selected first and second addresses, to thereby accomplish selection of addresses of a successive range.

5. The frame memory device of claim 4, wherein each of the range selectable column address decoder and the range selectable row address decoder is a 8-to-256 range selectable decoder, and wherein the 8-to-256 range selectable decoder comprises:
   an exclusive OR gate which judges whether or not values of four upper bits in the two high and low address inputs equal one other, and selects only one group if the values of four upper bits equal one another, but selects two or more groups if the values of four upper bits do not equal one another, to thereby generate an output selection signal with respect to a multiplexer;

a group selection circuit having a first range selectable address decoder for selecting a range between four upper bits of the two high and low addresses, and generating a low enable signal, a middle enable signal, and a high enable signal which select a low group, a middle group and a high group, respectively, if four upper bits of the two high and low address inputs do not equal one another;

a second range selectable decoder for selecting a range value between "1111" and four lower bits of a low address input value in order to select a low address range among 16 addresses in the low group selected by the four lower bits of the low address input;

a third range selectable decoder for selecting a range value between "0000" and four lower bits of a high address input value in order to select a high address range among 16 addresses in the high group selected by the four lower bits of the high address input;

a first multiplexer for selectively outputting any one input among the four lower bits of the low address input and the "0000" to the third range selectable decoder, according to an output of the group selection circuit;

a second multiplexer group having 16 multiplexers, in which "0" is input to one input terminal of each multiplexer and a low enable signal is input to the other terminal thereof, and the output of the group selection circuit is input as an output selection signal;

a third multiplexer group having 16 multiplexers, in which "0" is input to one input of each multiplexer and a middle enable signal is input to the other input thereof, and the output of the group selection circuit is input as an output selection signal;

a fourth multiplexer group having 16 multiplexers, in which the output of the first range selectable decoder is input to one input of each multiplexer and a high enable signal is input to the other input thereof, and the output of the group selection circuit is input as an output selection signal;

a first AND gate group having 16 AND gates in which the output of the second range selectable decoder is connected to one input of each AND gate and each output of the 16 multiplexers in the second multiplexer group is connected to the other input thereof;

a second AND gate group having 16 AND gates in which 16'hffff is applied to one input of each AND gate and each output of the 16 multiplexers in the third multiplexer group is connected to the other input thereof, in order to output "1" to all outputs of the 16 AND gates, so that all addresses between the selected low and high addresses are selected;

a third AND gate group having 16 AND gates in which the output of the third range selectable decoder is connected to one input of each AND gate and each output of the 16 multiplexers in the fourth multiplexer group is connected to the other input thereof; and an OR gate for logically summing the outputs of the first through third gate groups.

6. The frame memory device of claim 5, wherein the group selection circuit comprises:

a first range selectable decoder for selecting a range value between four upper bits of each of two high and low address inputs;

a right shift register for shifting the output of the first range selectable decoder by one bit to the right;

a left shift register for shifting the output of the first range selectable decoder by one bit to the left;

a first inverter for inverting the output of the right shift register;

a second inverter for inverting the output of the left shift register;

a low enable signal generator for generating a low enable signal which selects and enables a low group in combination with the output of the right shift register, the output of the first range selectable decoder, and the output of the first inverter;

a middle enable signal generator for generating a middle enable signal which selects and enables a middle group in combination with the output of the right shift register, the output of the first range selectable decoder, and the output of the left shift register; and a high enable signal generator for generating a high enable signal which selects and enables a high group in combination with the output of the second inverter, the output of the first range selectable decoder, and the output of the left shift register.

7. The frame memory device of claim 5, wherein if the four upper bits of the two high and low address inputs are same one another, the group selection circuit selects only one group, so that all the outputs of the first multiplexer and the second through fourth multiplexers are selected as zero port input to thus have all the outputs of the first and second AND gate groups selected as "0", and wherein one bit of the output of the first range selectable decoder and all 16 bits of the Output of the third range selectable decoder are logically ANDed in the third AND gate group formed of 16 AND gates, to thereby generate column and row address selection signals.

8. The frame memory device of claim 5, wherein if the four upper bits of the two high and low address inputs are not same one another, the group selection circuit generates a group enable signal for selecting a number of groups, and thus all the outputs of the first multiplexer and the second through fourth multiplexer groups are selected as "1" port input, so that the low address range belonging to the low group selected from the first AND gate group is selected by the output of the second range selectable decoder, the middle address range belonging to the middle group selected from the second AND gate group is selected, the high address range belonging to the high group selected from the third AND gate group is selected by the output of the third range selectable decoder.

9. The frame memory device of claim 5, wherein each of the first through third range selectable decoders is a 4-to-16 range selectable decoder, and wherein the 4-to-16 range selectable address decoder comprises:

a first general purpose decoder for generating a 16-bit decoded output when the four-bit low address is applied thereto;

a second general purpose decoder for generating a 16-bit decoded output when the four-bit high address is applied thereto; and first through thirtieth XOR gates for processing first through sixteenth outputs of the first general purpose decoder and first through sixteenth outputs of the second decoder, and selecting a range value between the low address and the high address.

10. The frame memory device of claim 8, wherein each of the first through third range selectable decoders is a 4-to-16 range selectable decoder, and wherein the 4-to-16 range selectable address decoder comprises:

a first general purpose decoder for generating a 16-bit decoded output when the four-bit low address is applied thereto;

a second general purpose decoder for generating a 16-bit decoded output when the four-bit high address is applied thereto; and first through thirtieth XOR gates for processing first through sixteenth outputs of the first decoder and first through sixteenth outputs of the second decoder, and selecting a range value between the low address and the high address.

11. The frame memory device of claim 1, wherein each of the range selectable column address decoder and the range selectable row address decoder is a 8-to-256 range selectable decoder.

12. The frame memory device of claim 11, wherein each of the range selectable column address decoder and the range selectable row address decoder performs selection of an address of a successive range, respectively, in which the total 256 addresses are divided into 16 groups in the case that the first and second column addresses and the first and second row addresses are 8-bit signals, respectively, a corresponding group by respective four upper bits of the first and second address inputs in units of 16 addresses, a low address range is selected among 16 addresses in the group selected by four lower bits of the low address input among the first and second addresses, a high address range is selected among 16 addresses in the group selected by four lower bits of the high address input among the first and second addresses, and all successive addresses are selected between the selected first and second addresses, to thereby accomplish selection of addresses of a successive range.

13. A frame memory device comprising:
a number of memory cells aligned in a matrix form;
a range selectable column address decoder for receiving high and low column addresses and generating at least one column address selection signal in order to designate at least one column address range with respect to the number of memory cells; and
a general purpose row address decoder for receiving high and low row addresses and generating two row address selection signals in order to designate two row addresses with respect to the number of memory cells,
wherein memory cells located from a low column address to a high column address designated by the range selectable column address decoder, are designated on two row lines designated by the general purpose row address decoder according to the input of the high and low row addresses, to thereby write graphic data of two parallel lines that are parallel with the X-axis.

14. The frame memory device of claim 13, wherein the range selectable column address decoder comprises a 8-to-256 range selectable decoder, and
the general purpose row address decoder comprises:
first and second general purpose 8-to-256 decoders for enabling one output among 256 outputs when 8-bit high and low addresses are input thereto; and
first through 256th OR gates for logically summing the outputs of an identical level from the first and second 8-to-256 decoders.

15. A frame memory device comprising:
a number of memory cells aligned in a matrix form;
a range selectable row address decoder for receiving high and low row addresses and generating at least one row address selection signal in order to designate at least one row address range with respect to the number of memory cells; and
a general purpose column address decoder for receiving high and low column addresses and generating two column address selection signals in order to designate two column addresses with respect to the number of memory cells,
wherein memory cells located from a low row address to a high row address which are designated by the range selectable address decoder, are designated on two column lines designated by the general purpose column address decoder according to the input of the high and low row addresses, to thereby write graphic data of two parallel lines that are parallel with the Y-axis.

16. A frame memory device comprising:
a number of memory cells aligned in a matrix form;
a first general purpose decoder for receiving high and low column addresses and generating two column address selection signals to designate two column addresses with respect to the number of memory cells; and
a second general purpose decoder for receiving high and low row addresses and generating two row address selection signals to designate two row addresses with respect to the number of memory cells,
wherein graphic data is written by a single write operation all at a time, in four memory cells of a point where two row lines designated by the second general purpose address decoder according to the input of the high and low row addresses and two column lines designated by the first general purpose address decoder according to the input of the high and low column addresses cross-sect each other.

17. The frame memory device of claim 16, wherein each of the first and second general purpose address decoders comprises:
first and second general purpose 8-to-256 decoders for enabling one output among 256 outputs when 8-bit high and low addresses are input thereto; and
first through 256th OR gates for logically summing the outputs of an identical level from the first and second 8-to-256 decoders.

18. An 8-to-256 range selectable decoder for selecting a successive range value between a high address and a low address when 8-bit high and low addresses are applied thereto, the 8-to-256 range selectable decoder comprises:
an exclusive OR gate which judges whether or not values of four upper bits in the two high and low address inputs equal one other, and selects only one group if the values of four upper bits equal one another, but selects two or more groups if the values of four upper bits do not equal one another, to thereby generate an output selection signal with respect to a multiplexer;
a group selection circuit having a first 4-to-16 range selectable address decoder for selecting a range between four upper bits of the two high and low addresses, and generating a low enable signal, a middle enable signal, and a high enable signal which select a low group, a middle group and a high group, respectively, if four upper bits of the two high and low address inputs do not equal one another;
a second 4-to-16 range selectable decoder for selecting a range value between "1111" and four lower bits of a low address input value in order to select a low address range among 16 addresses in the low group selected by the four lower bits of the low address input;
a third 4-to-16 range selectable decoder for selecting a range value between "0000" and four lower bits of a high address input value in order to select a high address range among 16 addresses in the high group selected by the four lower bits of the high address input;
a first multiplexer for selectively outputting any one input among the four lower bits of the low address input and the "0000" to the input terminal of the third 4-to-16 range selectable decoder, according to an output of the group selection circuit;

a second multiplexer group having 16 multiplexers, in which "0" is input to one input terminal of each multiplexer and a low enable signal is input to the other terminal thereof, and the output of the group selection circuit is input as an output selection signal;

a third multiplexer group having 16 multiplexers, in which "0" is input to one input terminal of each multiplexer and a middle enable signal is input to the other terminal thereof, and the output of the group selection circuit is input as an output selection signal;

a fourth multiplexer group having 16 multiplexers, in which the output of the first 4-to-16 range selectable decoder is input to one input terminal of each multiplexer and a high enable signal is input to the other terminal thereof, and the output of the group selection circuit is input as an output selection signal;

a first AND gate group having 16 AND gates in which the output of the second 4-to-16 range selectable decoder is connected to one terminal of each AND gate and each output of the 16 multiplexers in the second multiplexer group is connected to the other input terminal thereof;

a second AND gate group having 16 AND gates in which 16'hffff is applied to one terminal of each AND gate and each output of the 16 multiplexers in the third multiplexer group is connected to the other input terminal thereof, in order to output "1" to all outputs of the 16 AND gates, so that all addresses between the selected low and high addresses are selected;

a third AND gate group having 16 AND gates in which the output of the third 4-to-16 range selectable decoder is connected to one terminal of each AND gate and each output of the 16 multiplexers in the fourth multiplexer group is connected to the other input terminal thereof; and an OR gate for logically summing the outputs of the first through third gate groups.

* * * * *